(12) United States Patent
Shim et al.

(10) Patent No.: US 8,945,973 B2
(45) Date of Patent: Feb. 3, 2015

(54) METHOD OF MANUFACTURING BACKSIDE ILLUMINATED ACTIVE PIXEL SENSOR ARRAY

(71) Applicant: Samsung Electronics Co., Ltd., Suwon-si (KR)

(72) Inventors: Eun-sub Shim, Anyang-si (KR); Jung-chak Ahn, Yongin-si (KR); Bum-suk Kim, Hwaseong-si (KR); Kyung-ho Lee, Bucheon-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 13/950,954

(22) Filed: Jul. 25, 2013

(65) Prior Publication Data

US 2013/0344639 A1 Dec. 26, 2013

Related U.S. Application Data

(62) Division of application No. 13/252,560, filed on Oct. 4, 2011, now Pat. No. 8,508,013.

(30) Foreign Application Priority Data

Oct. 26, 2010 (KR) ........................ 10-2010-0104747

(51) Int. Cl.
*H01L 21/00* (2006.01)
*H01L 27/146* (2006.01)

(52) U.S. Cl.
CPC .... *H01L 27/14683* (2013.01); *H01L 27/14621* (2013.01); *H01L 27/14627* (2013.01); *H01L 27/1463* (2013.01); *H01L 27/1464* (2013.01); *H01L 27/14687* (2013.01)
USPC .......................................................... 438/73

(58) Field of Classification Search
CPC .................. H01L 27/14621; H01L 27/14627; H01L 27/14683; H01L 27/1464; H01L 27/14687; H01L 27/1463

USPC ................................................ 438/57, 70, 73
See application file for complete search history.

(56) References Cited

U.S. PATENT DOCUMENTS 6,218,691 B1 * 4/2001 Chung et al. .................. 257/290
7,884,436 B2 2/2011 Mabuchi
(Continued)

FOREIGN PATENT DOCUMENTS

| JP | 2006-261372 | 9/2006 |
| JP | 2007-335905 | 12/2007 |

(Continued)

OTHER PUBLICATIONS

"Backside Illuminated Active Pixel Sensor Array and Backside Illuminated Image Sensor Including the Same" Specification, Drawings, Claims and Prosecution History of U.S. Appl No. 13/252,560, filed Oct. 4, 2011 by Eun-sub Shim, et al.

*Primary Examiner* — Nikolay Yushin
(74) *Attorney, Agent, or Firm* — Onello & Mello, LLP

(57) ABSTRACT

A backside-illuminated active pixel sensor array in which crosstalk between adjacent pixels is prevented, a method of manufacturing the backside-illuminated active pixel sensor array, and a backside-illuminated image sensor including the backside-illuminated active pixel sensor array are provided. The backside-illuminated active pixel sensor array includes a semiconductor substrate of a first conductive type that comprises a front surface and a rear surface, light-receiving devices for generating charges in response to light incident via the rear surface, and one or more pixel isolating layers for forming boundaries between pixels by being disposed between the adjacent light-receiving devices, a wiring layer disposed on the front surface of the semiconductor substrate, and a light filter layer disposed on the rear surface of the semiconductor substrate, wherein a thickness of the one or more pixel isolating layers decreases from a point in the semiconductor substrate toward the rear surface.

13 Claims, 21 Drawing Sheets

(56) References Cited

U.S. PATENT DOCUMENTS

| | | |
|---|---|---|
| 8,587,081 B2 * | 11/2013 | Chao .......................... 257/432 |
| 2005/0179053 A1 * | 8/2005 | Ezaki et al. ................ 257/189 |
| 2008/0173963 A1 | 7/2008 | Hsu et al. |
| 2009/0189234 A1 | 7/2009 | Mabuchi |
| 2010/0032785 A1 | 2/2010 | Maruyama et al. |
| 2010/0140733 A1 | 6/2010 | Lee et al. |
| 2010/0297805 A1 | 11/2010 | Mabuchi |
| 2011/0019050 A1 | 1/2011 | Yamashita |
| 2011/0089517 A1 | 4/2011 | Venezia et al. |
| 2012/0080765 A1 | 4/2012 | Ku et al. |
| 2012/0098078 A1 | 4/2012 | Shim et al. |

FOREIGN PATENT DOCUMENTS

| | | |
|---|---|---|
| JP | 2008-294218 | 12/2008 |
| JP | 2009-206356 | 9/2009 |

* cited by examiner

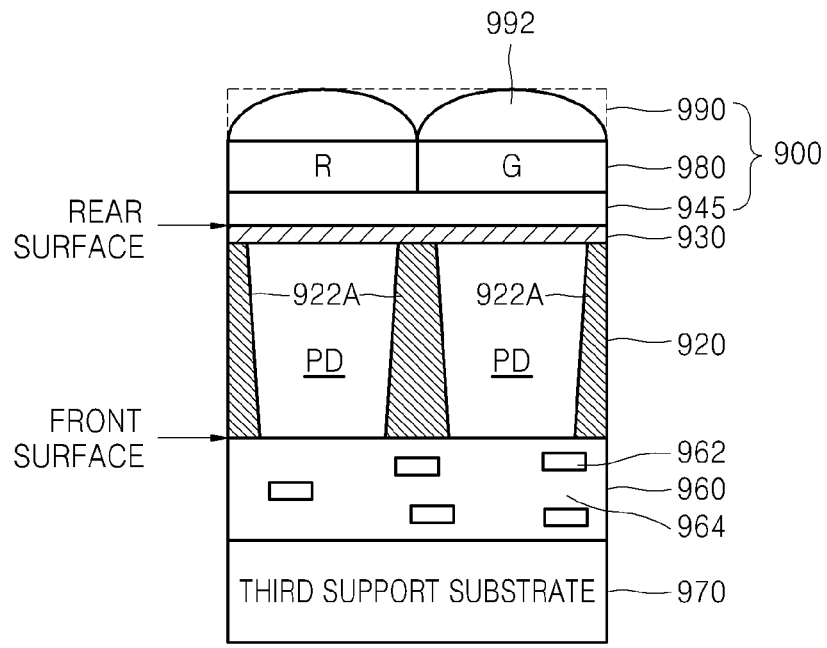
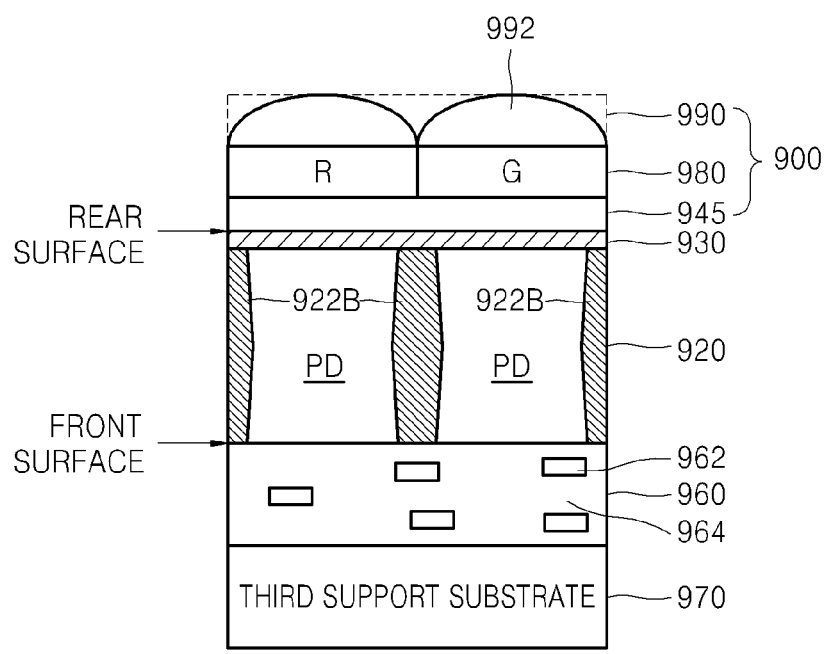

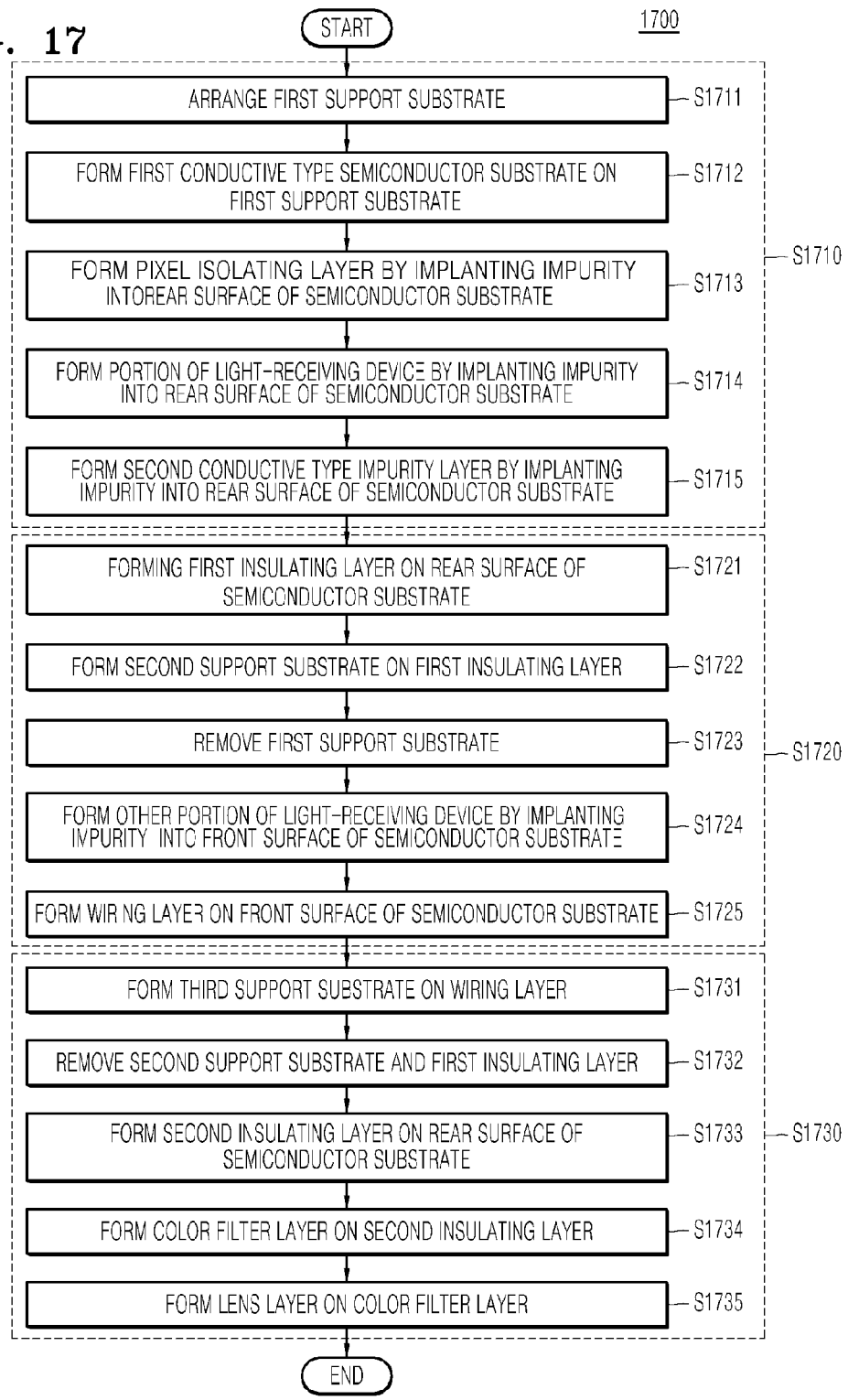

METHOD OF MANUFACTURING BACKSIDE ILLUMINATED ACTIVE PIXEL SENSOR ARRAY

CROSS-REFERENCE TO RELATED APPLICATIONS

This application is a divisional application of U.S. patent application Ser. No. 13/252,560, filed on Oct. 4, 2011, which claims the benefit of Korean Patent Application No. 10-2010-0104747, filed on Oct. 26, 2010, in the Korean Intellectual Property Office, the contents of which applications are incorporated herein in their entirety by reference.

FIELD OF INVENTION

The inventive concept relates to a backside illuminated image sensor, and more particularly, to a backside-illuminated active pixel sensor array in which crosstalk is prevented and color reproduction is improved by effectively blocking crosstalk between adjacent pixels, a method of manufacturing the backside-illuminated active pixel sensor array, and a backside-illuminated image sensor including the backside-illuminated active pixel sensor array.

BACKGROUND

Recently, a backside-illuminated image sensor has been introduced to an image sensor field. The backside-illuminated image sensor has an improved light-receiving efficiency, which is accomplished by having a wiring layer arranged on a front surface of a semiconductor substrate and by receiving light from a rear surface of the semiconductor substrate. In general, the backside-illuminated image sensor includes a backside-illuminated active pixel sensor array in which a plurality of pixels are arrayed in a matrix. Each pixel has a photodiode for receiving an optical signal incident via the rear surface of the semiconductor substrate and for converting the light signal into an electrical signal. However, in the backside-illuminated active pixel sensor array according to the related art, charges that are generated in a specific pixel move to a photodiode of an adjacent pixel thereby causing crosstalk.

SUMMARY

According to an aspect of the inventive concept, there is provided a backside-illuminated active pixel sensor array, including a semiconductor substrate of a first conductive type that comprises a front surface and a rear surface, light-receiving devices for generating charges in response to light incident via the rear surface, and one or more pixel isolating layers configured to form boundaries between pixels by being disposed between the adjacent light-receiving devices; a wiring layer disposed on the front surface of the semiconductor substrate; and a light filter layer disposed on the rear surface of the semiconductor substrate, wherein a thickness of the one or more pixel isolating layers decreases from a point in the semiconductor substrate toward the rear surface.

The thickness of the one or more pixel isolating layers may decrease from the point in the semiconductor substrate toward the front surface.

A doping density of the one or more pixel isolating layers may increase from the point in the semiconductor substrate toward the rear surface.

A doping density of the one or more pixel isolating layers may increase from the point in the semiconductor substrate toward the front surface.

The backside-illuminated active pixel sensor array may further include a second conductive type impurity layer disposed at a region adjacent to the rear surface of the semiconductor substrate.

Each of the light-receiving devices may include a first conductive type impurity region having a greater doping density than the semiconductor substrate.

According to another aspect of the inventive concept, there is provided a method of manufacturing a backside-illuminated active pixel sensor array. The method includes (a) forming a semiconductor substrate of a first conductive type that comprises a front surface and a rear surface, light-receiving devices for generating charges in response to light incident via the rear surface, and one or more pixel isolating layers forming boundaries between pixels by being disposed between the adjacent light-receiving devices; (b) forming a wiring layer on the front surface of the semiconductor substrate; and (c) forming a light filter layer on the rear surface of the semiconductor substrate, wherein portions or all of the one or more pixel isolating layers are second conductive type impurity doped regions formed by ion implantation at the rear surface of the semiconductor substrate.

The forming in part (a) may include arranging a first support substrate; forming the semiconductor substrate on the first support substrate; and forming the one or more pixel isolating layers by implanting an impurity into the rear surface of the semiconductor substrate.

The forming in part (a) may further include the forming a second conductive type impurity layer by implanting an impurity into the rear surface of the semiconductor substrate.

The forming in part (a) may further include a second conductive type impurity layer by implanting an impurity into the rear surface of the semiconductor substrate.

The forming in part (b) may include forming a first insulating layer on the rear surface of the semiconductor substrate; forming a second support substrate on the first insulating layer; removing the first support substrate; and forming the wiring layer on the front surface of the semiconductor substrate.

The forming in part (a) may include arranging a first support substrate; forming the semiconductor substrate on the first support substrate; and forming portions of the one or more pixel isolating layers by implanting an impurity into the rear surface of the semiconductor substrate.

The forming in part (b) may further include forming the other portions of the one or more pixel isolating layers by implanting an impurity into the front surface of the semiconductor substrate.

The forming in part (b) may further include forming a first conductive type impurity region of each of the light-receiving devices by implanting an impurity into the front surface of the semiconductor substrate, and the first conductive type impurity region of each of the light-receiving devices may have a greater doping density than the semiconductor substrate.

The forming in part (c) may include forming a third support substrate on the wiring layer; removing the second support substrate and the first insulating layer; forming a second insulating layer on the rear surface of the semiconductor substrate; forming a color filter layer on the second insulating layer; and forming a lens layer on the color filter layer.

According to another aspect of the inventive concept, there is provided a backside-illuminated image sensor that includes a backside-illuminated active pixel sensor array, a row driver for driving the backside-illuminated active pixel sensor array by a unit of rows, and a signal processing unit for processing a signal output from the backside-illuminated active pixel sensor array. The backside-illuminated active pixel sensor array may include a semiconductor substrate of a first conductive type that includes a front surface and a rear surface, light-receiving devices for generating charges in response to light incident via the rear surface, and one or more pixel isolating layers configured to form boundaries between pixels by being disposed between the adjacent light-receiving devices; a wiring layer disposed on the front surface of the semiconductor substrate; and a light filter layer disposed on the rear surface of the semiconductor substrate, wherein a thickness of the one or more pixel isolating layers decreases from a point in the semiconductor substrate toward the rear surface.

A width of the one or more pixel isolating layers may decrease from a point in the semiconductor substrate toward the rear surface.

A width of the one or more pixel isolating layers may decrease from a point in the semiconductor substrate toward the front surface.

Each of the light-receiving devices may include a first conductive type impurity region having a greater doping density than the semiconductor substrate.

BRIEF DESCRIPTION OF THE DRAWINGS

Exemplary embodiments of the inventive concept will be more clearly understood from the following detailed description, taken in conjunction with the accompanying drawings in which:

FIGS. 9 through 16B are cross-sectional views illustrating an embodiment of a method of manufacturing the backside-illuminated active pixel sensor arrays of the embodiments of FIGS. 1 and 2, according to aspects of the inventive concept;

FIG. 17 is a flowchart of another embodiment of a method of manufacturing the backside-illuminated active pixel sensor array of FIG. 3, according to aspects of the inventive concept;

DETAILED DESCRIPTION OF THE EMBODIMENTS

Figure 1:
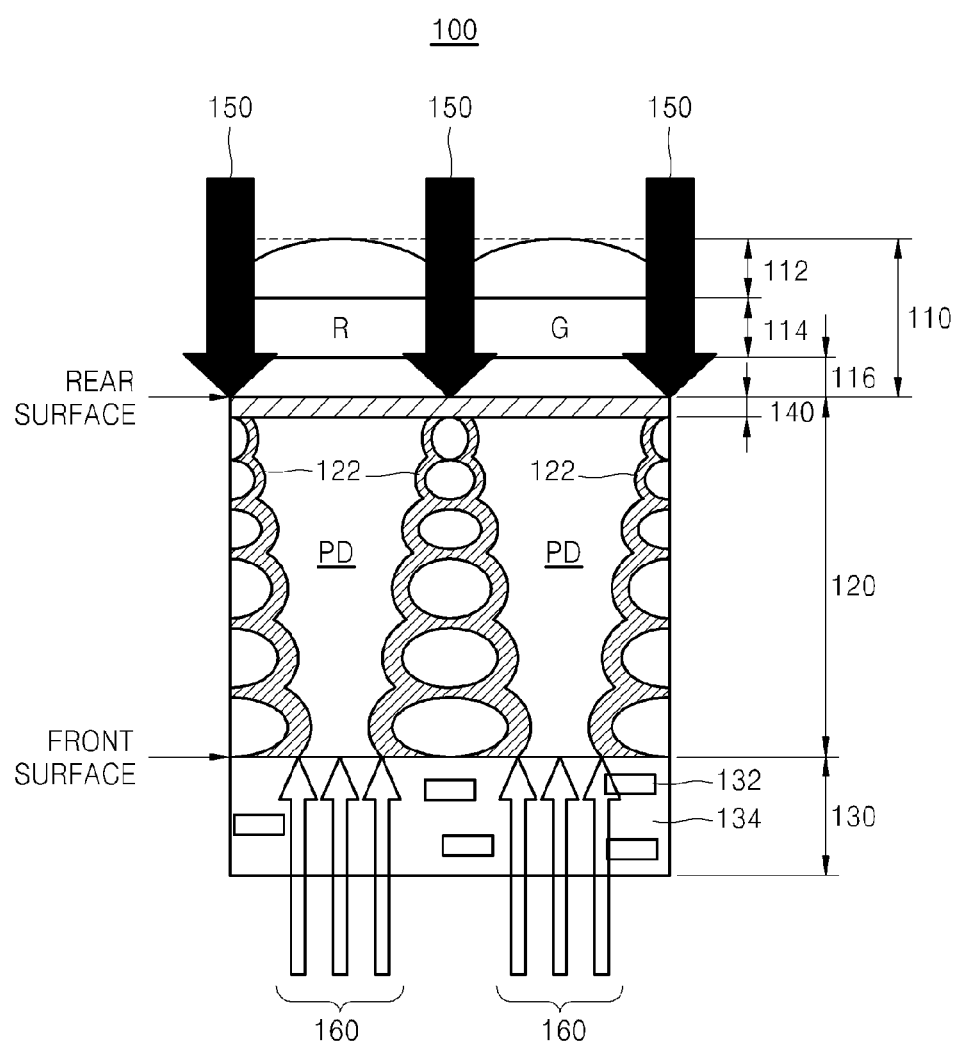
FIG. 1 is a cross-sectional view illustrating an embodiment of a vertical structure of a backside-illuminated active pixel sensor array, according to aspects of the inventive concept.

The present invention now will be described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below" or "beneath" and "above" or "upper", may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures.

It will be understood that, although the terms first, second, etc. may be used herein to describe various elements, these elements should not be limited by these terms. These terms are only used to distinguish one element from another. For example, a first signal or layer could be termed a second signal or layer, and, similarly, a second signal or layer could be termed a first signal or layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It should also be noted that in some alternative implementations, the functions noted in the blocks may occur out of the order. For example, two blocks illustrated in succession may in fact be executed substantially concurrently or the blocks may sometimes be executed in the reverse order, depending upon the functionality involved.

Hereinafter, the inventive concept will be described in detail by explaining exemplary embodiments of the inventive concept with reference to the attached drawings.

FIG. 1 is a cross-sectional view illustrating an embodiment of a vertical structure of a backside-illuminated active pixel sensor array 100 according to aspects of the inventive concept.

Referring to FIG. 1, the backside-illuminated active pixel sensor array 100 includes a light filter layer 110, a semiconductor substrate 120 having a front surface and a rear surface via which light is incident, and a wiring layer 130. In more detail, the light filter layer 110 is disposed on the rear surface of the semiconductor substrate 120, and the wiring layer 130 is disposed on the front surface of the semiconductor substrate 120. The light filter layer 110 may include a lens layer 112, a color filter layer 114, and an insulating layer 116. The wiring layer 130 may be formed of an interlayer insulating layer 134 and a metal wiring layer 132 that are alternately stacked.

The semiconductor substrate 120 may be a first conductive type (e.g., N-type) semiconductor substrate, such as a bulk substrate, an epitaxial substrate, or a Silicon-On-Insulator (SOI) substrate, as examples. The semiconductor substrate 120 includes a plurality of light-receiving devices PD that generate charges in response to incident light, and one or more pixel isolating layers (or pixel isolation regions) 122 that form boundaries between pixels by being disposed between the adjacent light-receiving devices PD. The semiconductor substrate 120 may further include a floating diffusion region (not shown) and various types of circuit devices (not shown) including at least one transistor, in various embodiments.

The pixel isolating layer 122 is a doped region that is formed in a depth direction in the semiconductor substrate 120. Here, in this embodiment, the depth direction indicates a vertical direction towards the rear surface of the semiconductor substrate 120, wherein the rear surface is considered to be deeper than the front surface of the semiconductor substrate 120. The pixel isolating layer 122 may be a second conductive type (e.g., P-type) doped region formed in the semiconductor substrate 120 of the first conductive type. The pixel isolating layer 122 forms a potential barrier to prevent the movement of charges generated in the light-receiving device PD to an adjacent pixel, i.e., crosstalk. The potential barrier is determined according to a doping profile of the pixel isolating layer 122. As a thickness (or a width) of the pixel isolating layer 122 decreases, and as a doping density increases, the potential barrier is increased. Here, the thickness (or the width) of the pixel isolating layer 122 indicates a size of the pixel isolating layer 122, which is defined in a parallel direction to the rear surface of the semiconductor substrate 120. In ion implantation performed in impurity doping, an ion beam is diffused as an impurity implantation depth increases, so that, as a depth of a doped region increases, it is difficult to control a thickness (or a width) of the doped region when the region is to be small (or narrow). Also, it is more difficult to control the thickness (or the width) of the doped region to be small while a doping density is increased.

The backside-illuminated active pixel sensor array 100 of FIG. 1 includes the pixel isolating layer 122 that is formed in a manner that an impurity is implanted into the rear surface of the semiconductor substrate 120. The impurity implantation direction in which the pixel isolating layer 122 is formed is the same as an incident direction of light. Since ion implantation is performed at the rear surface of the semiconductor substrate 120, the doping profile of the pixel isolating layer 122 may be formed to have a small thickness and a high doping density near the rear surface of the semiconductor substrate 120, which is where a lot of charges are generated.

In other words, the doping profile of the pixel isolating layer 122 may have at least one of following characteristics. First, the thickness (or the width) of the pixel isolating layer 122 decreases towards the rear surface of the semiconductor substrate 120, and increases towards the front surface of the semiconductor substrate 120. Second, a density of the pixel isolating layer 122 increases towards the rear surface of the semiconductor substrate 120, and decreases towards the front surface of the semiconductor substrate 120. Accordingly, the pixel isolating layer 122 included in the backside-illuminated active pixel sensor array 100 of FIG. 1 forms the potential barrier, which is relatively high and sharply slanted, near the rear surface of the semiconductor substrate 120. By doing so, charge movement between pixels near the rear surface of the semiconductor substrate 120 may be effectively prevented to thus minimize crosstalk.

The light-receiving device PD generates charges by receiving light entering via the rear surface of the semiconductor substrate 120, and accumulates the charges. When the transistor (not shown) disposed near the front surface of the semiconductor substrate 120 is turned on, the accumulated charges are delivered to the floating diffusion region (not shown) via the transistor. Thus, the light-receiving device PD needs to generate sufficient charges according to an amount of incident light and to accumulate the charges well. According to a doping condition of the semiconductor substrate 120, if desired, the light-receiving device PD may be formed by additionally implanting a first conductive type (e.g., N-type) impurity 160 into the semiconductor substrate 120. Here, a doping density of the light-receiving device PD is greater than a doping density of the semiconductor substrate 120.

FIG. 1 corresponds to an example in which the first conductive type (e.g., N-type) impurity 160 is implanted into the front surface of the semiconductor substrate 120 (refer to reference numeral 160 of FIG. 1) so as to form an impurity region of the light-receiving device PD. That is, in the example of FIG. 1, the light-receiving device PD is formed by the ion implantation (refer to reference numeral 160 of FIG. 1) at the front surface of the semiconductor substrate 120, and the pixel isolating layer 122 is formed by the ion implantation (refer to reference numeral 150 of FIG. 1) at the rear surface of the semiconductor substrate 120. Thus, a doping profile of the light-receiving device PD may have an opposite characteristic to the doping profile of the pixel isolating layer 122. In the example embodiment of FIG. 1, to clearly illustrate the characteristic of the pixel isolating layer 122, the doping profile of the light-receiving device PD is not separately illustrated and the doping profile of the pixel isolating layer 122 is relatively emphasized. The light-receiving device PD may include a photodiode, a phototransistor, a photogate, a pinned photodiode (PPD) or a combination thereof, as examples.

An impurity layer 140 of a second conductive type (e.g., P-type) may be disposed near the rear surface of the semiconductor substrate 120. The impurity layer 140 may be formed on the rear surface of the semiconductor substrate 120 or may be formed by implanting an impurity into a region near the rear surface of the semiconductor substrate 120 and then by performing a thermal treatment. The impurity layer 140 isolates the light-receiving device PD from a defect such as a dangling bond existing near the rear surface of the semiconductor substrate 120. The impurity layer 140 effectively functions to make holes flow to a ground voltage source GND, wherein the holes are from electron-hole pairs (EHPs) that are generated by light. Also, the impurity layer 140 minimizes the occurrence of a dark current by decreasing an effect of a crystal defect existing on an interface of the semiconductor substrate 120. As a doping density of the impurity layer 140 is increased, a decrease effect with respect to the dark current is improved. Since light is incident on the light-receiving device PD via the impurity layer 140, impurity layer 140 needs to have an appropriate thickness. If the thickness of the impurity layer 140 is too great, a light-receiving efficiency deteriorates. On the other hand, if the thickness of the impurity layer 140 is too small, dark current may increase.

Figure 2:
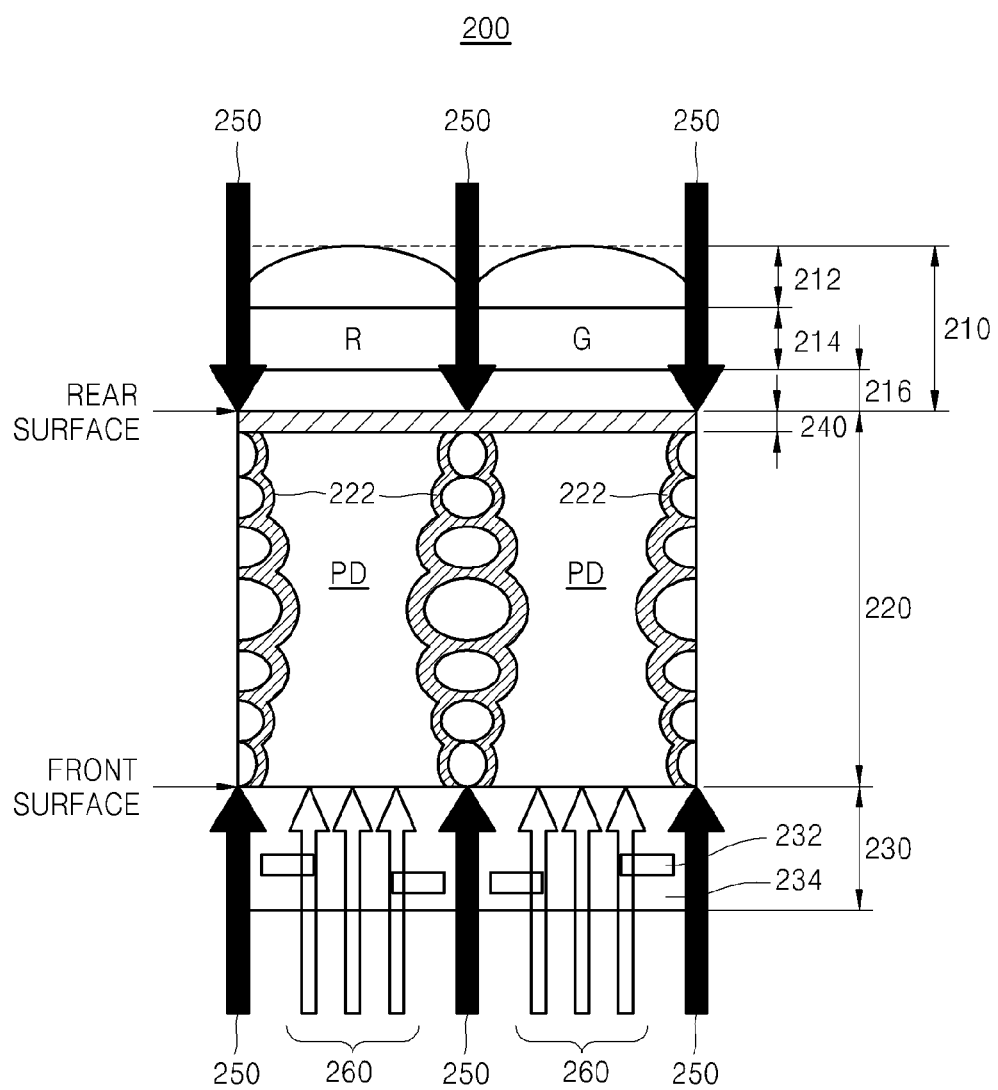
FIG. 2 is a cross-sectional view illustrating another embodiment of a vertical structure of a backside-illuminated active pixel sensor array, according to aspects of the inventive concept.

FIG. 2 is a cross-sectional view illustrating another embodiment of a vertical structure of a backside-illuminated active pixel sensor array 200 according to aspects of the inventive concept.

Referring to FIG. 2, the backside-illuminated active pixel sensor array 200 is similar to the backside-illuminated active pixel sensor array 100 of FIG. 1. Thus, detailed descriptions for elements, features, or principles that are the same as those with reference to FIG. 1 are omitted. Hereinafter, a pixel isolating layer 222 and a light-receiving device PD will now be described in detail.

The backside-illuminated active pixel sensor array 200 includes one or more pixel isolating layers 222 that form boundaries between pixels by disposed between the light-receiving devices PD in a semiconductor substrate 220. The pixel isolating layer 222 is a doped region that is formed in the semiconductor substrate 220 in the depth direction, as described above. The pixel isolating layer 222 may be a second conductive type (e.g., P-type) doped region formed in the semiconductor substrate 220 of a first conductive type (e.g., N-type). Unlike the pixel isolating layer 122 of FIG. 1, which is formed by the ion implantation (refer to reference numeral 150 of FIG. 1), at the rear surface of the semiconductor substrate 120, the pixel isolating layer 222 is formed by implanting an impurity into a front surface and a rear surface of the semiconductor substrate 220, i.e., both surfaces of the semiconductor substrate 220 (refer to reference numeral 250 of FIG. 2). In other words, a portion of the pixel isolating layer 222 is formed by implanting the impurity into the rear surface of the semiconductor substrate 220, and the other portion of the pixel isolating layer 222 is formed by implanting the impurity into the front surface of the semiconductor substrate 220. A doping profile of the pixel isolating layer 222 formed by performing the ion implantation into both surfaces of the semiconductor substrate 220 may have at least one of following characteristics. First, a thickness (or a width) of the pixel isolating layer 222 decreases from a predetermined point in the pixel isolating layer 222 toward both surfaces of the semiconductor substrate 220. Second, a doping density of the pixel isolating layer 222 increases from the predetermined point toward both surfaces of the semiconductor substrate 220. Accordingly, the backside-illuminated active pixel sensor array 200 has relatively high and sharply slanted potential barriers that are formed by the pixel isolating layer 222 at both surfaces of the semiconductor substrate 220. By doing so, the pixel isolating layer 222 has a small thickness and a high doping density not only at the front surface of the semiconductor substrate 220, but also at the rear surface of the semiconductor substrate 220 in which a lot of charges are generated to thus effectively prevent crosstalk.

Figure 3:
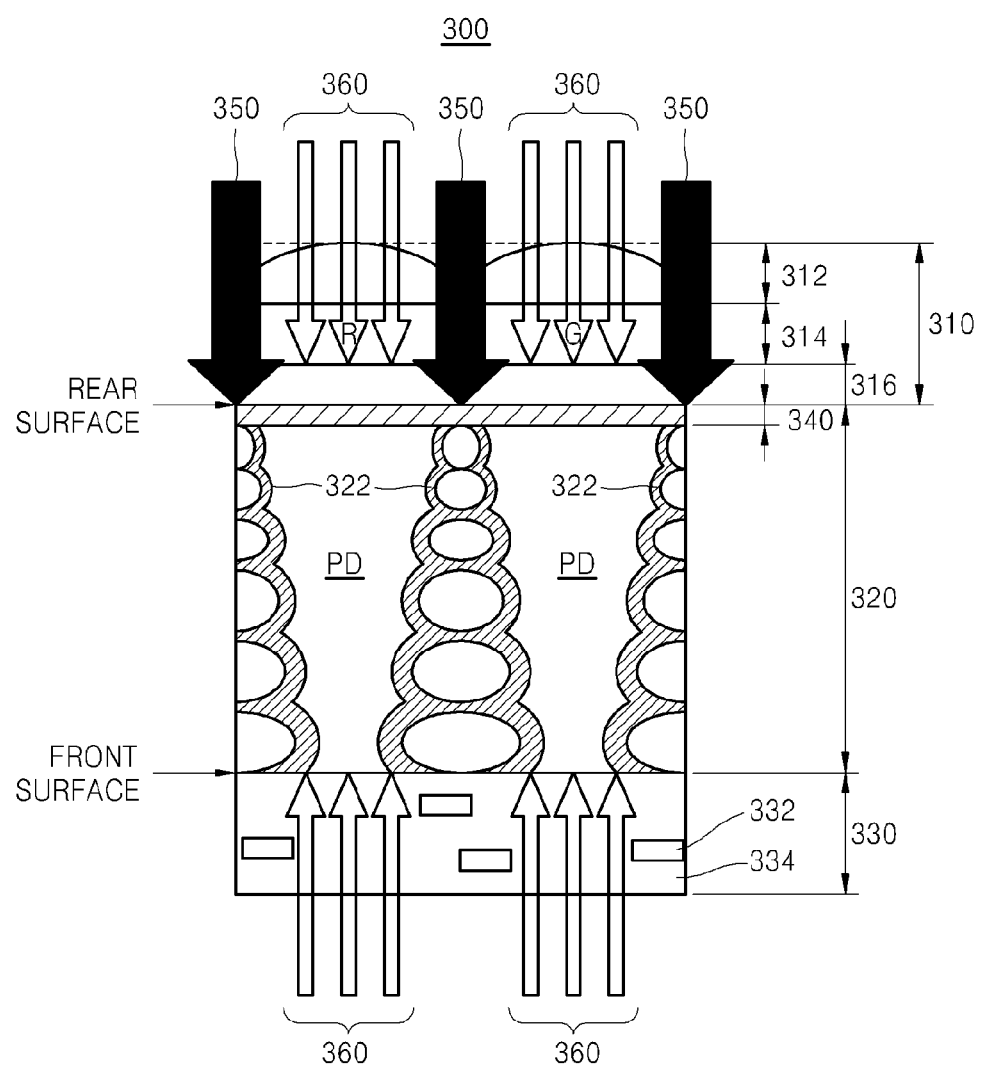
FIG. 3 is a cross-sectional view illustrating another embodiment of a vertical structure of a backside-illuminated active pixel sensor array, according to aspects of the inventive concept.
Figure 4:
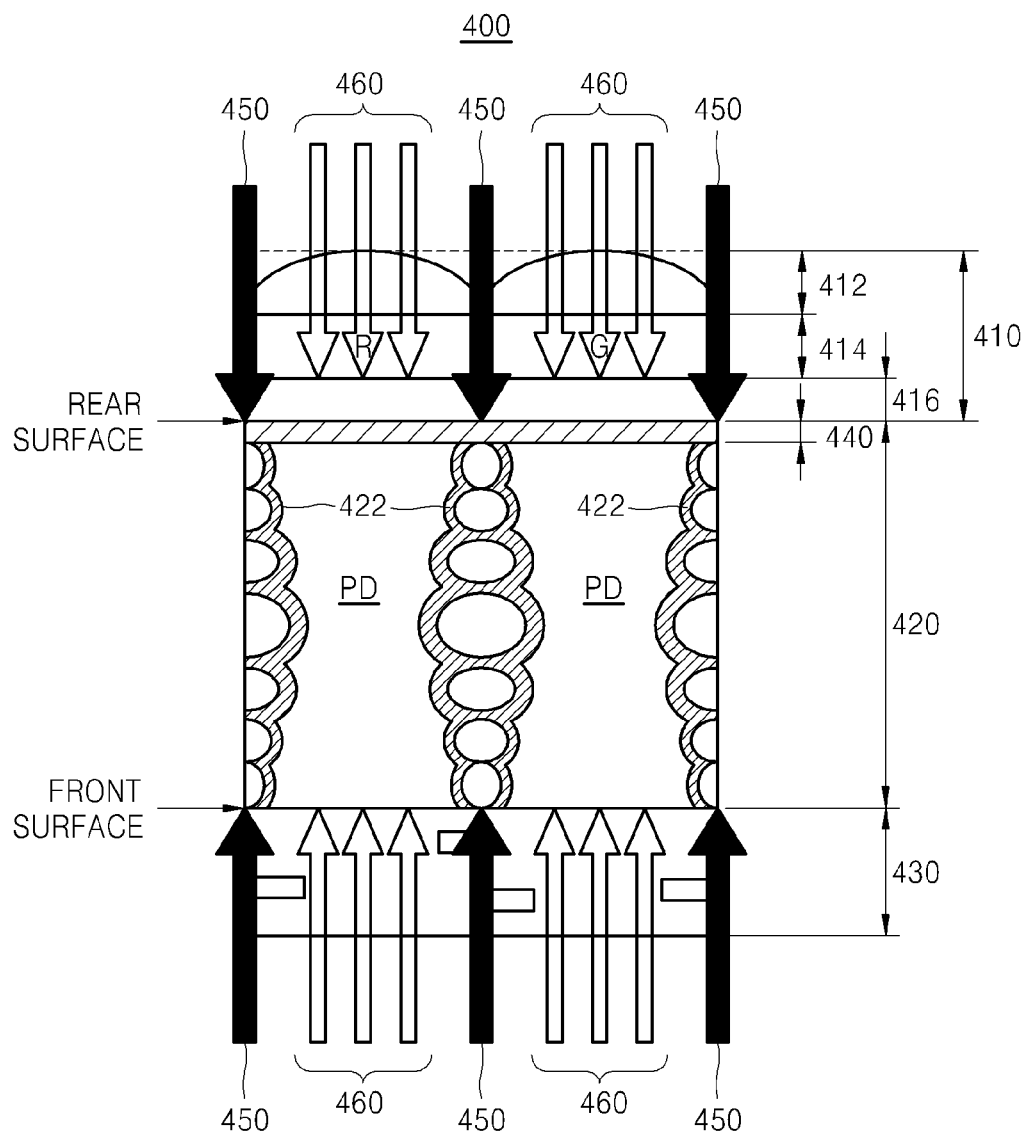
FIG. 4 is a cross-sectional view illustrating another embodiment of a vertical structure of a backside-illuminated active pixel sensor array, according to aspects of the inventive concept.

FIGS. 3 and 4 are cross-sectional views illustrating another embodiment of vertical structures of backside-illuminated active pixel sensor arrays 300 and 400 according to aspects of the inventive concept. Referring to FIGS. 3 and 4, other elements, features, or principles, except for a light-receiving device PD, are similar to the previous embodiments of FIGS. 1 and 2. In more detail, the embodiments of FIGS. 1 and 2 include light-receiving devices PD that are formed by implanting ion into the rear surfaces of the semiconductor substrates 120 and 220, whereas the present embodiments of FIGS. 3 and 4 include light-receiving devices PD that are formed by implanting ions into front surfaces and rear surfaces of semiconductor substrates 320 and 420 respectively, i.e., both surfaces of the semiconductor substrate 220.

However, pixel isolating layers 322 and 422 included in the present embodiments of FIGS. 3 and 4 are respectively similar to the pixel isolating layers 122 and 222 included in the previous embodiments of FIGS. 1 and 2.

Figure 5:
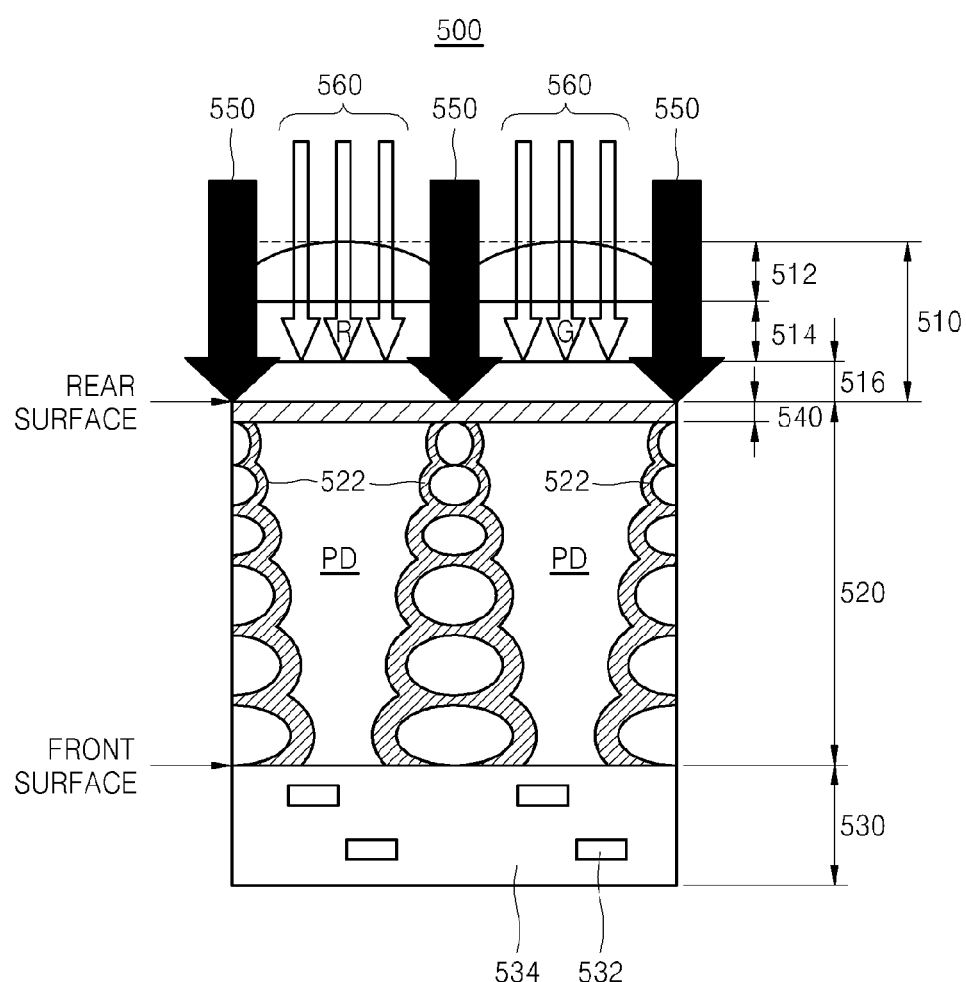
FIG. 5 is a cross-sectional view illustrating another embodiment of a vertical structure of a backside-illuminated active pixel sensor array, according to aspects of the inventive concept.
Figure 6:
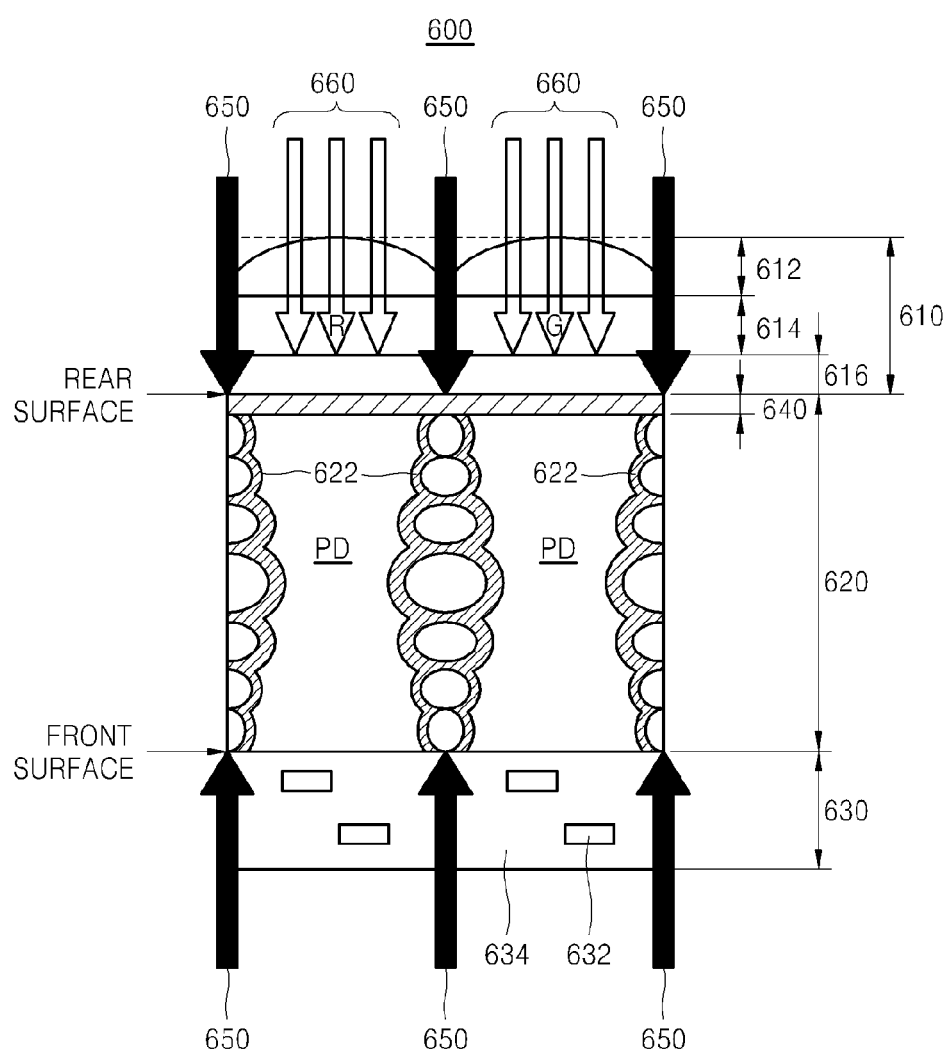
FIG. 6 is a cross-sectional view illustrating another embodiment of a vertical structure of a backside-illuminated active pixel sensor array, according to aspects of the inventive concept.

FIGS. 5 and 6 are cross-sectional views illustrating another embodiment of vertical structures of backside-illuminated active pixel sensor arrays 500 and 600 according to aspects of the inventive concept. Referring to FIGS. 5 and 6, other elements, features, or principles, except for a light-receiving device PD, are similar to the previous embodiments of FIGS. 1 and 2. In more detail, the embodiments of FIGS. 1 and 2 include light-receiving devices PD that are formed by implanting ions into the rear surfaces of the semiconductor substrates 120 and 220, whereas the present embodiments of FIGS. 5 and 6 include light-receiving devices PD that are formed by implanting ions into front surfaces of semiconductor substrates 520 and 620.

However, pixel isolating layers 522 and 622 included in the present embodiments of FIGS. 5 and 6 are respectively similar to the pixel isolating layers 122 and 222 included in the previous embodiments of FIGS. 1 and 2.

Figure 7:
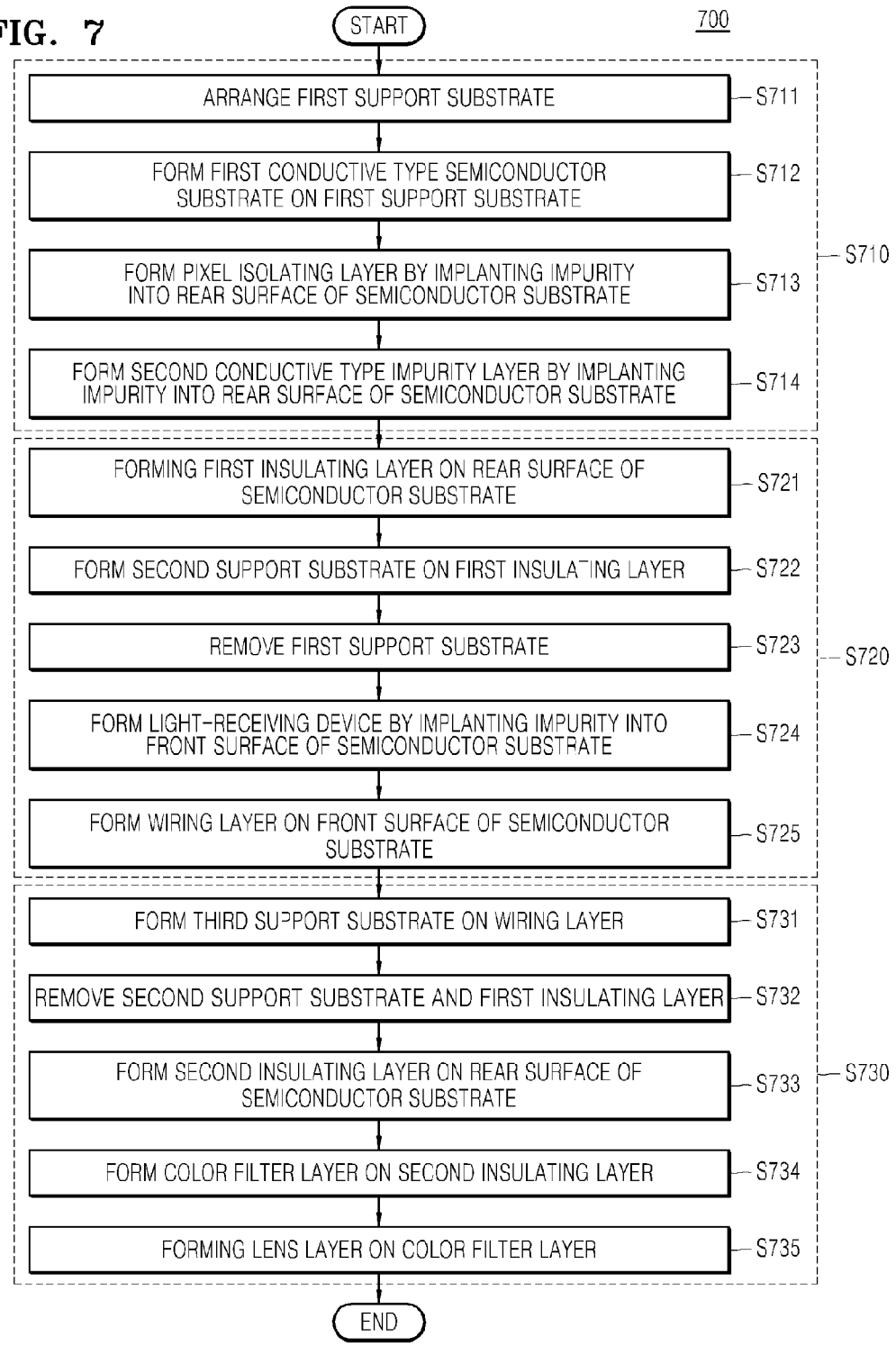
FIG. 7 is a flowchart of an embodiment of a method of manufacturing the backside-illuminated active pixel sensor array of FIG. 1, according to aspects of the inventive concept.

FIG. 7 is a flowchart of an embodiment of a method 700 of manufacturing the backside-illuminated active pixel sensor array 100 of FIG. 1, according to aspects of the inventive concept.

Referring to FIGS. 1 and 7, the method 700 of manufacturing the backside-illuminated active pixel sensor array 100 of FIG. 1 includes operations of forming the semiconductor substrate 120 (operation S710), forming the wiring layer 130 (operation S720), and forming the light filter layer 110 (operation S730). Operation S710 includes arranging a first support substrate (not shown) (operation S711), forming the semiconductor substrate 120 of a first conductive type (e.g., N-type) on the first support substrate (operation S712), forming one or more pixel isolating layers 122 by implanting an impurity into a rear surface of the semiconductor substrate 120, wherein the one or more pixel isolating layers 122 form boundaries between pixels by being disposed between light-receiving devices PD (operation S713), and forming the impurity layer 140 of a second conductive type (e.g., P-type) by implanting an impurity into the rear surface of the semiconductor substrate 120 (operation S714).

Operation S720 includes forming a first insulating layer (not shown) on the rear surface of the semiconductor substrate 120 (operation S721), forming a second support substrate (not shown) on the first insulating layer (operation S722), removing the first support substrate (operation S723), forming a plurality of the light-receiving devices PD by implanting an impurity into a front surface of the semiconductor substrate 120 (operation S724), and forming the wiring layer 130 on the front surface of the semiconductor substrate 120 (operation S725).

Operation S730 includes forming a third support substrate (not shown) on the wiring layer 130 (operation S731), removing the second support substrate and the first insulating layer (operation S732), forming the second insulating layer 116 on the rear surface of the semiconductor substrate 120 (operation S733), forming the color filter layer 114 on the second insulating layer 116 (operation S734), and forming the lens layer 112 on the color filter layer 114 (operation S735).

Figure 8:
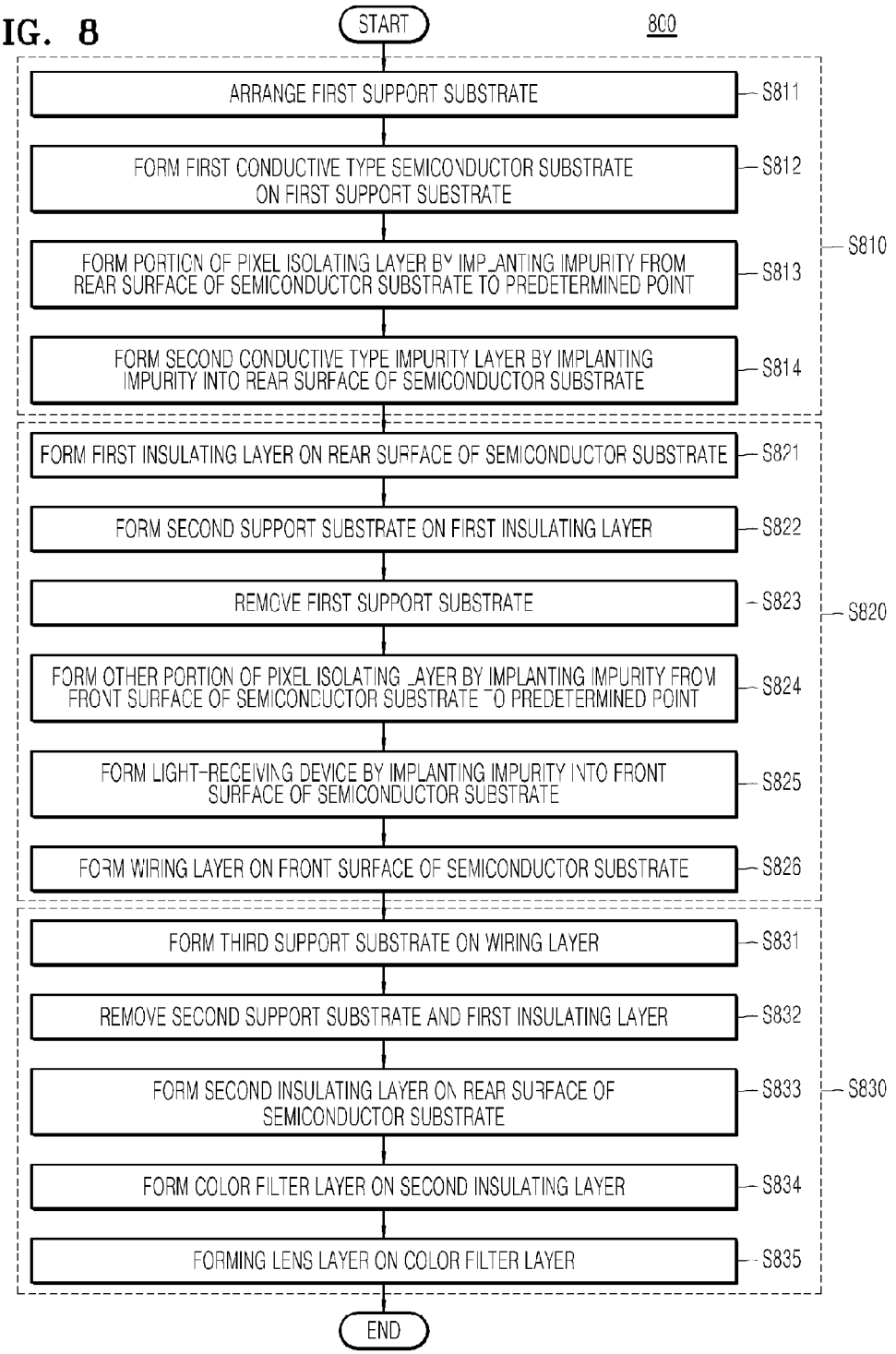
FIG. 8 is a flowchart of another embodiment of a method of manufacturing the backside-illuminated active pixel sensor array of FIG. 2, according to aspects of the inventive concept.

FIG. 8 is a flowchart of another embodiment of a method 800 of manufacturing the backside-illuminated active pixel sensor array 200 of FIG. 2, according to aspects of the inventive concept.

Referring to FIGS. 2 and 8, the method 800 of manufacturing the backside-illuminated active pixel sensor array 200 of FIG. 2 includes operations of forming the semiconductor substrate 220 (operation S810), forming a wiring layer 230 (operation S820), and forming a light filter layer 210 (operation S830). Operation S810 includes providing or arranging a first support substrate (not shown) (operation S811), forming the semiconductor substrate 220 of a first conductive type (e.g., N-type) on the first support substrate (operation S812), forming portions of the one or more pixel isolating layers 222 by implanting an impurity into a rear surface of the semiconductor substrate 220 (operation S813), and forming an impurity layer 240 of a second conductive type (e.g., P-type) by implanting an impurity into the rear surface of the semiconductor substrate 220 (operation S814).

Operation S820 includes forming a first insulating layer (not shown) on the rear surface of the semiconductor substrate 220 (operation S821), forming a second support substrate (not shown) on the first insulating layer (operation S822), removing the first support substrate (operation S823), forming the other portions of the one or more pixel isolating layers 222 by implanting an impurity into a front surface of the semiconductor substrate 220 (operation S824), forming a plurality of light-receiving devices PD by implanting an impurity into the front surface of the semiconductor substrate 220 (operation S825), and forming the wiring layer 230 on the front surface of the semiconductor substrate 220 (operation S826).

Operation S830 includes forming a third support substrate (not shown) on the wiring layer 230 (operation S831), removing the second support substrate and the first insulating layer (operation S832), forming a second insulating layer 216 on the rear surface of the semiconductor substrate 220 (operation S833), forming a color filter layer 214 on the second insulating layer 216 (operation S834), and forming a lens layer 212 on the color filter layer 214 (operation S835).

FIGS. 9 through 16 are cross-sectional views illustrating an embodiment of a method of manufacturing the backside-illuminated active pixel sensor arrays 100 and 200 of the embodiments of FIGS. 1 and 2, according to aspects of the inventive concept.

Figure 9:
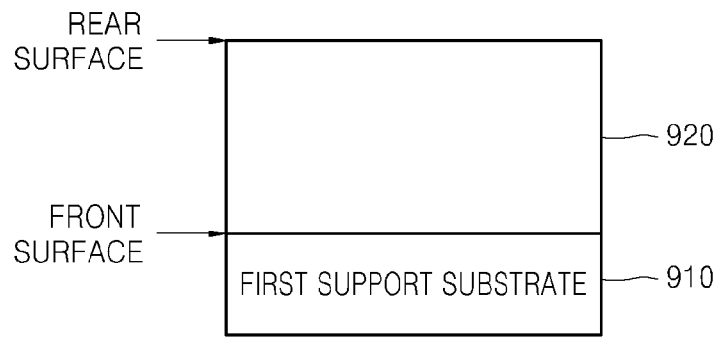

First, referring to FIG. 9, in order to manufacture the backside-illuminated active pixel sensor array embodiments of FIGS. 1 and 2, a first support substrate 910 is arranged, and a semiconductor substrate 920 having a front surface and a rear surface is formed on the first support substrate 910. The front surface of the semiconductor substrate 920 faces the first support substrate 910, and the rear surface of the semiconductor substrate 920 is exposed. The semiconductor substrate 920 may be a first conductive type (e.g., N-type) semiconductor substrate. The semiconductor substrate 920 may be selected from the group comprising a bulk substrate, an epitaxial substrate, and an SOI substrate.

Figure 10A:
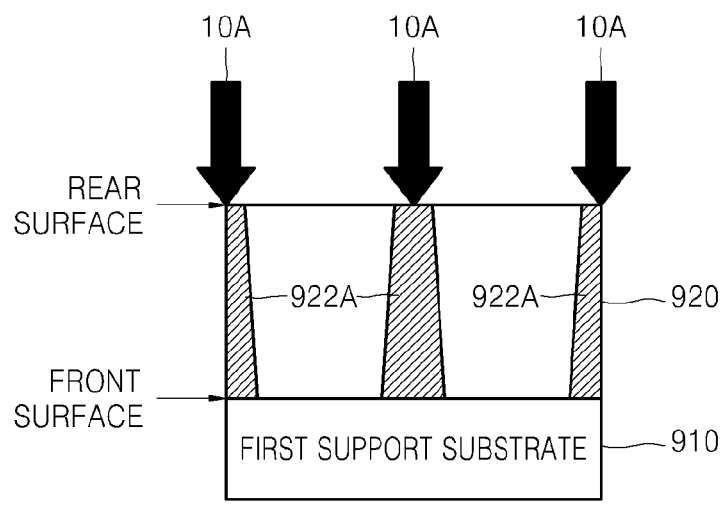
Figure 10B:
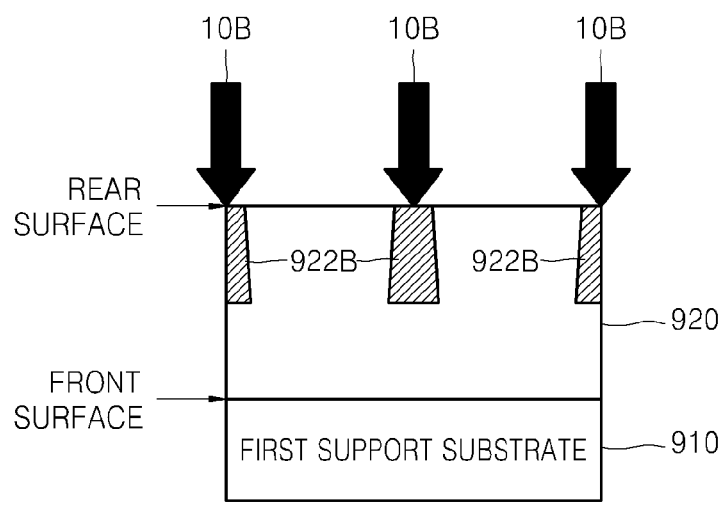

Referring to FIGS. 10A-10B, one or more pixel isolating layers 922A and 922B are formed in the semiconductor substrate 920. FIG. 10A illustrates an embodiment of a method of manufacturing the backside-illuminated active pixel sensor array embodiment of FIG. 1, and FIG. 10B illustrates a method of manufacturing the backside-illuminated active pixel sensor array embodiment of FIG. 2. In more detail, referring to the embodiment of FIG. 1, the pixel isolating layer 122 is formed by implanting ions into only a rear surface of the semiconductor substrate 120. Thus, FIG. 10A illustrates a case in which the pixel isolating layers 922A are formed by implanting an impurity into only the rear surface of the semiconductor substrate 920.

On the other hand, referring to the embodiment of FIG. 2, the pixel isolating layer 222 is formed by implanting ions into a front surface and a rear surface of the semiconductor substrate 220, i.e., both surfaces of the semiconductor substrate 220. Thus, FIG. 10B illustrates a case in which portions of the pixel isolating layers 922B are formed by implanting an impurity into the rear surface of the semiconductor substrate 920. Afterward, a process of forming the other portions of the pixel isolating layers 922B may be further performed. The pixel isolating layers 922A and 922B are doped regions of the second conductive type (e.g., P-type) formed by doping the semiconductor substrate 920 of the first conductive type (e.g., N-type) with an impurity. Due to a doping profile of the pixel isolating layers 922A and 922B, adjacent pixels are physically and electrically isolated from each other. Also, the pixel isolating layers 922A and 922B may have a trench structure that have surrounding regions doped with an impurity. The pixel isolating layers 922A and 922B form a potential barrier to prevent the movement of charges generated in each light-receiving device PD to an adjacent light-receiving device PD in the semiconductor substrate 920. By sufficiently increasing the potential barrier, crosstalk between adjacent pixels may be minimized. Hereinafter, the pixel isolating layers 922A and 922B are described in detail.

The pixel isolating layers 922A and 922B are formed by ion implantation, in this embodiment. The ion implantation is a technology that involves ionizing a material to be doped, accelerating the material to allow the material to have significant kinetic energy, and then forcibly implanting the material into a surface of a wafer. Although the ion implantation improves integrity by significantly reducing doping in a horizontal direction, compared to impurity doping by thermal diffusion, the ion implantation causes lattice defects. Also, in the ion implantation, as a doped region becomes deeper, and ion beam diffusion is applied such that a doped region in a horizontal direction is increased. Accordingly, it is difficult to accurately control a size and a density of the doped region.

The potential barrier formed by the pixel isolating layers 922A and 922B is increased as a thickness (or a width) of the doping profile of the pixel isolating layers 922A and 922B decreases and a doping density of the pixel isolating layers 922A and 922B increases. Thus, in a case of a doping profile of a portion in which the greatest amount of charges are generated so that crosstalk frequently occurs, the doping profile needs to have a thickness (or a width) that is as small as possible and to have a doping density that is as great as possible. In the backside-illuminated active pixel sensor arrays 100, 200, 300, 400, 500, and 600 of FIGS. 1 through 6, light entering via a rear surface of a semiconductor substrate is incident on each light-receiving device PD. Each light-receiving device PD generates charges corresponding to the amount of incident light, that is, the amount of photons, and in this regard, the greatest amount of photons reach a region of each light-receiving device PD. The region is adjacent to the rear surface of the semiconductor substrate, so that the greatest amount of charges are generated near the rear surface of the semiconductor substrate. Thus, if a potential barrier near the rear surface of the semiconductor substrate is sufficiently high, it is efficient to minimize crosstalk between adjacent pixels. Accordingly, in order to form the pixel isolating layers 922A and 922B, the method according to the present embodiment performs ion plantation 10A,B at a region near the rear surface of the semiconductor substrate 920 to accurately form a doping profile of the pixel isolating layers 922A and 922B at the region near the rear surface of the semiconductor substrate 920.

Figure 11A:
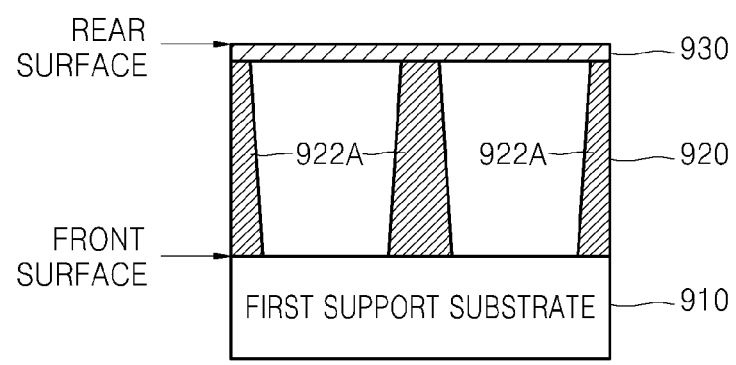
Figure 11B:
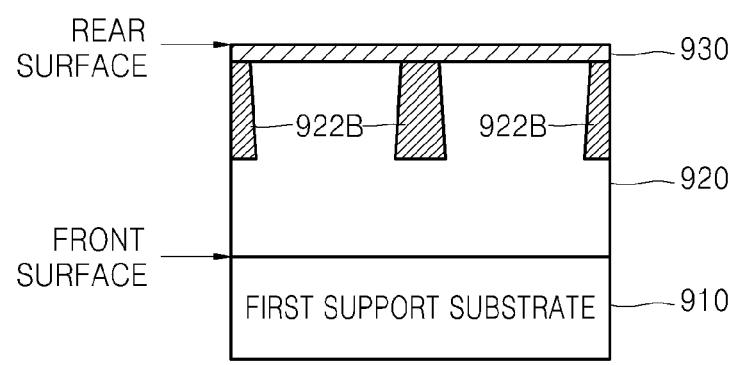

Referring to FIGS. 11A-11B, an impurity layer 930 is formed on the semiconductor substrate 920. FIG. 11A illustrates a method of manufacturing the backside-illuminated active pixel sensor array embodiment of FIG. 1, and FIG. 11B illustrates a method of manufacturing the backside-illuminated active pixel sensor array embodiment of FIG. 2. In more detail, referring to FIGS. 11A-11B, the impurity layer 930 is formed near the rear surface of the semiconductor substrate 920. The impurity layer 930 may be a second conductive type (e.g., P-type) epi-layer formed on the semiconductor substrate 920 of the first conductive type (e.g., N-type). Also, the impurity layer 930 may be formed by ion-implanting a second conductive type (e.g., P-type) impurity into the region near the rear surface of the semiconductor substrate 920 of the first conductive type (e.g., N-type). The impurity layer 930 isolates the light-receiving device PD from a defect such as a dangling bond existing near the rear surface of the semiconductor substrate 920. The impurity layer 930 effectively functions to make holes flow to a ground voltage source GND, wherein the holes are from among EHPs that are generated by light. Also, the impurity layer 930 minimizes the occurrence of a dark current by decreasing an effect of a crystal defect existing on an interface of the semiconductor substrate 920. As a doping density of the impurity layer 930 is increased, a decrease effect with respect to the dark current is improved. In the backside-illuminated active pixel sensor arrays 100, 200, 300, 400, 500, and 600 of FIGS. 1 through 6, light is incident on the light-receiving device PD via the impurity layer 930, so that the impurity layer 930 needs to have an appropriate thickness. If the thickness of the impurity layer 930 is too great, a light-receiving efficiency deteriorates. On the other hand, if the thickness of the impurity layer 930 is too small, the dark current may increase.

Referring to FIGS. 10A-10B and 11A-11B, the pixel isolating layers 922A and 922B are formed before the impurity layer 930 is formed. However, according to a depth of the impurity layer 930, the pixel isolating layers 922A and 922B may be formed after the impurity layer 930 is formed.

Figure 12A:
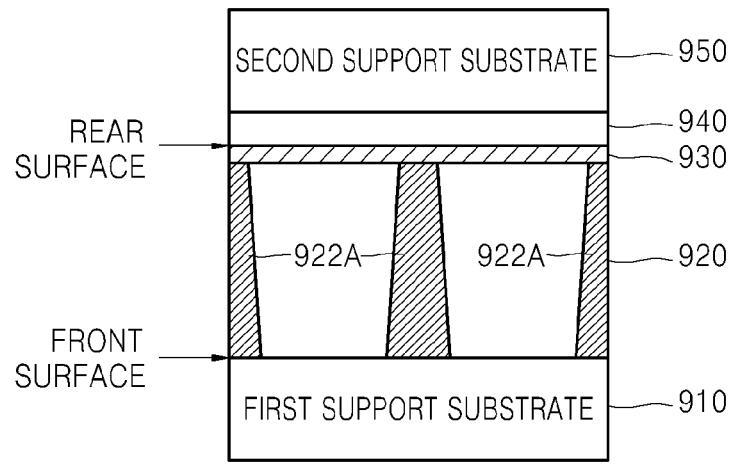
Figure 12B:
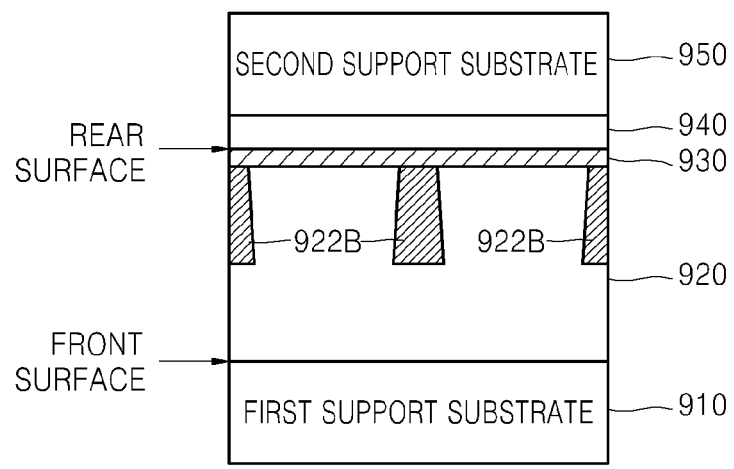

Referring to FIGS. 12A-12B, a first insulating layer 940 and a second support substrate 950 are formed on the impurity layer 930. FIG. 12A illustrates an embodiment of a method of manufacturing the backside-illuminated active pixel sensor array embodiment of FIG. 1, and FIG. 12B illustrates a method of manufacturing the backside-illuminated active pixel sensor array embodiment of FIG. 2. Referring to FIGS. 12A-12B, the first insulating layer 940 may be a passivation layer formed to protect the semiconductor substrate 920. Also, the first insulating layer 940 may be a planarization layer. The planarization layer may be formed of a polyimide-based material or a polyacryl-based material, which has excellent light-transmittance. The first insulating layer 940 may prevent light scattering or light reflection. The first insulating layer 940 may have a multi-layer structure formed by stacking materials having different refractive indexes. For example, the first insulating layer 940 can be formed as stacked layers formed by stacking an oxide layer and a nitride layer (oxide layer/nitride layer or nitride layer/oxide layer), or can be formed as stacked layers formed by stacking an oxide layer and a layer including carbon (SiC) (oxide layer/SiC or SiC/oxide layer). Here, the oxide layer may be formed of a material selected from the group comprising BoroPhosphoSilicate Glass (BPSG), PhosphoSilicate Glass (PSG), Boro-Silicate Glass (BSG), Un-doped Silicate Glass (USG), Tetra-Ethyl OrthoSilicate (TEOS), and High Density Plasma (HDP). The nitride layer may be formed as a silicon nitride layer ($Si_xN_y$, where x and y are a natural number) or as a silicon oxynitride layer ($Si_xO_yN_z$, where x, y, and z are a natural number).

Figure 13A:
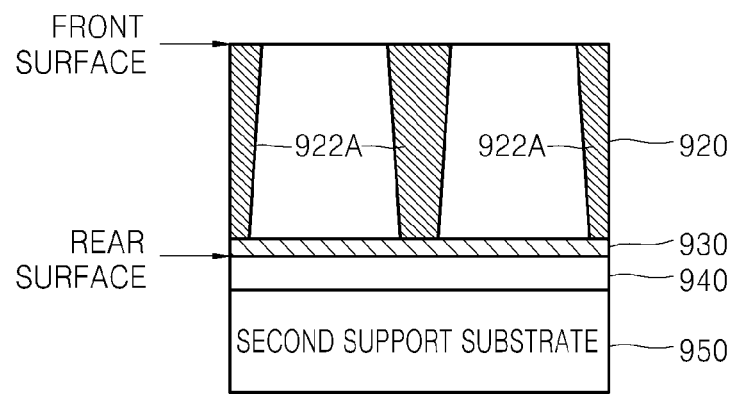
Figure 13B:
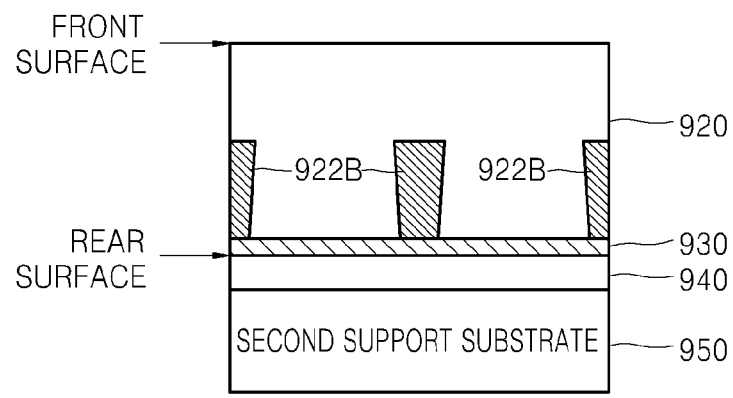

Referring to FIGS. 13A-13B, the first support substrate 910 is removed. FIG. 13A illustrates a method of manufacturing the backside-illuminated active pixel sensor array embodiment of FIG. 1, and FIG. 13B illustrates a method of manufacturing the backside-illuminated active pixel sensor array embodiment of FIG. 2. In more detail, referring to FIGS. 13A-13B, a multi-layer structure including the first support substrate 910 and the second support substrate 950 is turned over, so that the first support substrate 910 becomes an upper layer and the second support substrate 950 becomes a lower layer. Afterward, the first support substrate 910 that is the upper layer is removed. The first support substrate 910 may be removed by being cut about several hundreds of nanometers by using a grinder and then by removing the rest of several tens of nanometers by etching. By doing so, the front surface of the semiconductor substrate 920 is externally exposed.

Figure 14A:
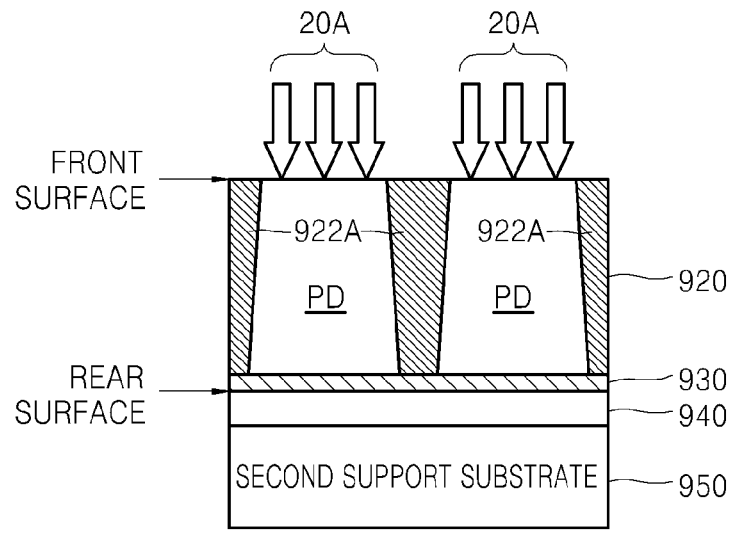
Figure 14B:
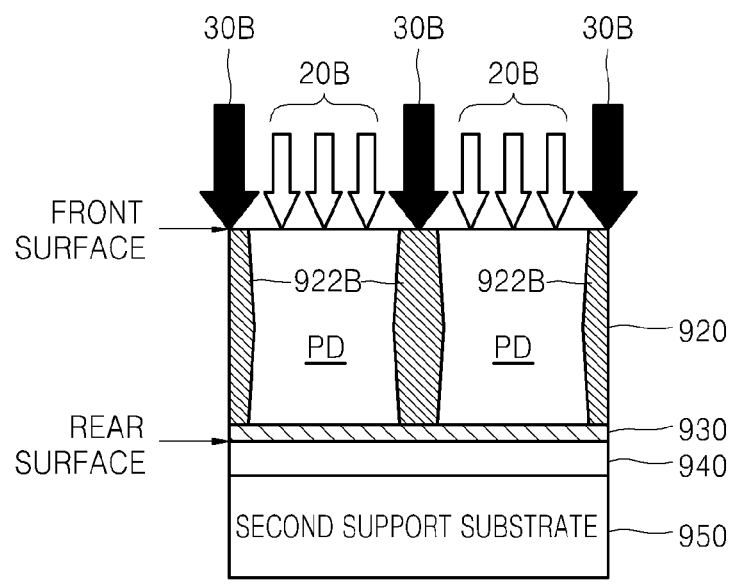

Referring to FIGS. 14A-14B, light-receiving devices PD are formed in the semiconductor substrate 920. FIG. 14A corresponds to a case in which the pixel isolating layers 922A are completely formed, so that only the light-receiving devices PD are formed without an additional process of forming the pixel isolating layers 922A. In FIG. 14A, the first conductive type (e.g., N-type) impurity is implanted (refer to reference numeral 20A of FIG. 14A) into the front surface of the semiconductor substrate 920, so that the light-receiving devices PD are formed. That is, the light-receiving devices PD are formed by the ion implantation 20A at the front surface of the semiconductor substrate 920, and the pixel isolating layers 922A are formed by ion implantation (refer to reference numeral 10A of FIG. 10A) at the rear surface of the semiconductor substrate 920.

On the other hand, FIG. 14B corresponds to a case in which portions of the pixel isolating layers 922B, and light-receiving devices PD are formed, while the other portions of the pixel isolating layers 922B have been already formed. In FIG. 14B, the light-receiving devices PD are formed by the ion implantation 20B at the front surface of the semiconductor substrate 920 (refer to reference numeral 20B of FIG. 14B), and the portions of the pixel isolating layers 922B are formed by the ion implantation (refer to reference numeral 10B of FIG. 10B) at the rear surface of the semiconductor substrate 920, and the other portions of the pixel isolating layers 922B are formed by ion implantation (refer to reference numeral 20B of FIG. 14B) at the front surface of the semiconductor substrate 920.

First, referring to FIG. 14B, an impurity is implanted (refer to reference numeral 10B of FIG. 10B) into the front surface of the semiconductor substrate 920, so that the other portions of the pixel isolating layers 922B are formed. Accordingly, unlike the pixel isolating layers 922A in FIG. 14A, the pixel isolating layers 922B are formed by implanting an impurity into the rear surface and the front surface of the semiconductor substrate 920, i.e., both surfaces of the semiconductor substrate 920. In other words, the portions of the pixel isolating layers 922B are formed by implanting an impurity into the rear surface of the semiconductor substrate 920, and the other portions of the pixel isolating layers 922B are formed by implanting an impurity into the front surface of the semiconductor substrate 920.

A doping profile of the pixel isolating layer 922B may have at least one of following characteristics. First, a thickness (or a width) of the pixel isolating layer 922B decreases from a predetermined point in the semiconductor substrate 920 toward both surfaces of the semiconductor substrate 920. Second, a doping density of the pixel isolating layer 922B increases from the predetermined point in the semiconductor substrate 920 toward both surfaces of the semiconductor substrate 920. Accordingly, the pixel isolating layer 922B forms a potential barrier that is relatively high and sharply slanted at both surfaces and by the semiconductor substrate 920. By doing so, the pixel isolating layer 922B has a small thickness and a high doping density not only at the front surface of the semiconductor substrate 920, but also at the rear surface of the semiconductor substrate 920 in which a significant amount of charges are generated to, thus, effectively prevent crosstalk between adjacent pixels.

Next, formation of the light-receiving devices PD is described with reference to FIGS. 14A and 14B. Referring to FIGS. 14A and 14B, according to a doping condition of the semiconductor substrate 920, the light-receiving devices PD are formed by additionally implanting a first conductive type (e.g., N-type) impurity into the semiconductor substrate 920. In a case where the semiconductor substrate 920 is doped with the first conductive type (e.g., N-type) impurity, a doping density of the light-receiving devices PD is greater than a doping density of the semiconductor substrate 920. Each light-receiving device PD is formed by implanting an impurity into the front surface of the semiconductor substrate 920. Also, a device isolating layer (not shown) may be formed near the front surface of the semiconductor substrate 920 to define an active region and an inactive region. A floating diffusion region (not shown) and transistors (not shown) are formed near the front surface of the semiconductor substrate 920 to deliver and to process charges generated in the light-receiving devices PD. In order to form the transistors, an impurity is implanted into the front surface of the semiconductor substrate 920, and a gate insulating layer (not shown), a gate electrode (not shown), or the like are formed.

The light-receiving device PD generates charges by receiving light entering via the rear surface of the semiconductor substrate 920 and accumulates the charges. When a transistor connecting the light-receiving device PD and a floating diffusion node is turned on, the accumulated charges are delivered to the floating diffusion region via the transistor. Thus, the light-receiving device PD needs to generate sufficient charges according to an amount of incident light and to readily accumulate the charges. The light-receiving device PD may be formed of a photodiode, a phototransistor, a photogate, a PPD or a combination thereof, as examples.

Figure 15A:
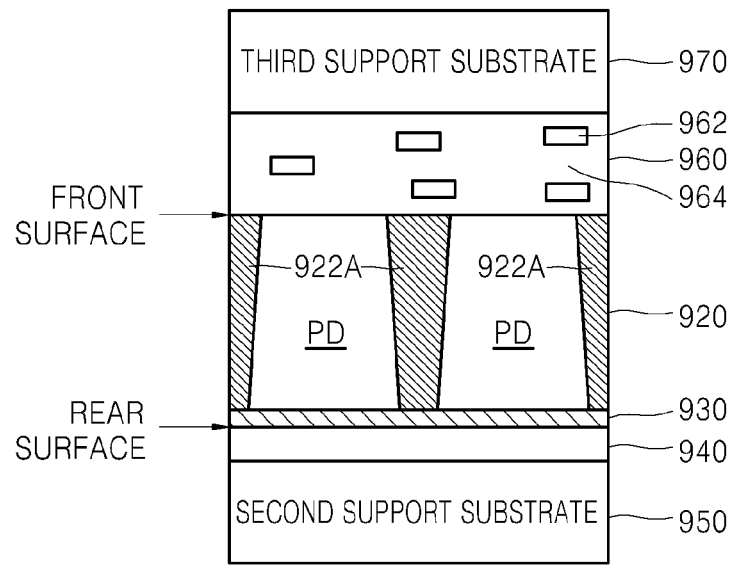
Figure 15B:
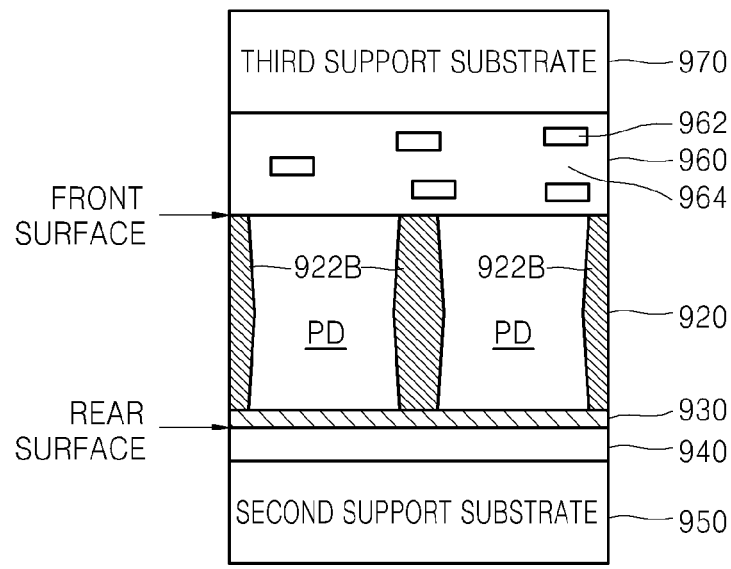

Referring to FIGS. 15A-15B, a wiring layer 960 and a third support substrate 970 are formed on the semiconductor substrate 920. The wiring layer 960 may have a structure in which a wiring 962 and an interlayer insulating layer 964 are stacked. The wiring layer 960 may be formed by performing deposition and etching. The wiring layer 960 may be formed of a conductive material, e.g., metal or a metal alloy layer formed by mixing at least two types of metal. The wiring layer 960 may be formed of aluminum (Al), as an example. The interlayer insulating layer 964 is formed of an insulating material, e.g., silicon oxide. Multi-layer wirings may be formed by repeating formation of the wiring 962 and formation of the interlayer insulating layer 964. The multi-layer wirings may be connected to wirings of different layers via contact plugs. The contact plugs may be formed in a corresponding interlayer insulating layer via a damascene process. In order to electrically connect wiring layers that are vertically stacked, the contact plug may be formed of a conductive material, e.g., a polycrystalline silicon layer doped with impurity ions, metal, or a metal alloy layer formed by mixing at least two types of metal. Preferably, the contact plug may be formed of tungsten (W). The interlayer insulating layer 964 may be formed of an oxide layer selected from the group comprising BPSG, PSG, BSG, USG, TEOS, and HDP or may be formed as stacked layers formed by stacking at least two layers selected from the aforementioned group. Also, the interlayer insulating layer 964 may be deposited and then may be planarized via a CMP process, for example. A passivation layer (not shown) may be formed on the interlayer insulating layer 964. Here, the passivation layer may be formed of a material selected from the group comprising BPSG, PSG, BSG, USG, TEOS, and HDP. Preferably, the passivation layer may be formed of TEOS or HDP. Otherwise, the passivation layer may be formed as a nitride layer or may be formed by stacking an oxide layer and a nitride layer. Afterward, the passivation layer is planarized. The planarizing process may be performed by using a CMP process, as an example.

Afterward, the third support substrate 970 is bonded to the wiring layer 960, thereby supporting one surface of the wiring layer 960.

Referring to FIGS. 16A-16B, a multi-layer structure including the second support substrate 950 (refer to FIGS. 15A and 15B) and the third support substrate 970 is turned over, so that the second support substrate 950 becomes an upper layer and the third support substrate 970 becomes a lower layer. Afterward, the second support substrate 950 that is the upper layer is removed. The second support substrate 950 may be removed by being cut about several hundreds of nanometers using a grinder and then by removing the rest of several tens of nanometers by etching, as an example.

After the second support substrate 950 is removed, a light filter layer 900 is formed on the rear surface of the semiconductor substrate 920. The light filter layer 900 includes a second insulating layer 945, a color filter layer 980, and a lens layer 990. First, the second insulating layer 945 is formed on the rear surface of the semiconductor substrate 920. The second insulating layer 945 may be a passivation layer formed to protect the semiconductor substrate 920. Also, the second insulating layer 945 may be a planarization layer. The planarization layer may be formed of a polyimide-based material or a polyacryl-based material, which has excellent light-transmittance. The second insulating layer 945 may prevent light scattering or light reflection. In this case, the second insulating layer 945 may have a multi-layer structure formed by stacking materials having different refractive indexes. For example, the second insulating layer 945 can be formed as stacked layers formed by stacking an oxide layer and a nitride layer (oxide layer/nitride layer or nitride layer/oxide layer), or can be formed as stacked layers formed by stacking an oxide layer and a layer including carbon (SiC) (oxide layer/SiC or SiC/oxide layer), as examples. Here, the oxide layer may be formed of a material selected from the group comprising BPSG, PSG, BSG, USG, TEOS, and HDP. The nitride layer may be formed as a silicon nitride layer ($Si_xN_y$, where x and y are a natural number) or as a silicon oxynitride layer ($Si_xO_yN_z$, where x, y, and z are a natural number).

Afterward, the color filter layer 980 can be formed on the second insulating layer 945. Then, the lens layer 990 can be formed on the color filter layer 980. The lens layer 990 includes a plurality of micro-lenses 992 for allowing light, which enters via the rear surface of the semiconductor substrate 920, to be focused on the light-receiving device PD in a corresponding pixel. Only necessary color light of the incident light via the micro-lenses 992 is selected by corresponding color filters R and G of the color filter layer 980, and the selected color light is incident on the light-receiving device PD of the corresponding pixel. A plurality of the color filters R and G respectively corresponding to the light-receiving devices PD are included in the color filter layer 980.

The lens layer 990 can be formed such that the micro-lenses 992 that have a predetermined curvature and an upwardly convex shape correspond to the light-receiving devices PD, respectively. After the color filter layer 980 is formed and before the lens layer 990 is formed, a planarization layer (not shown) may be formed. The planarization layer may be formed of a polyimide-based material or a polyacryl-based material, which has excellent light-transmittance. Afterward, a process of removing residues on a surface of the lens layer 990 may be performed. Also, a bake process may be performed so that the micro-lenses 992 maintain their shape.

Above with reference to FIGS. 16A-16B, it is described that the second insulating layer 945 can be formed on the rear surface of the semiconductor substrate 920 after the first insulating layer 940 is formed. However, the first insulating layer 940 may function as the second insulating layer 945, and thus, it is needless to additionally form the second insulating layer 945.

Also, the method of manufacturing the backside-illuminated active pixel sensor array embodiments of FIGS. 1 and 2 according to the present embodiment of FIGS. 9 through 16B may be applied to a method of manufacturing the backside-illuminated active pixel sensor array embodiments of FIGS. 3 through 6, but with some variations. The method of manufacturing the backside-illuminated active pixel sensor array embodiments of FIGS. 3 through 6 will be described with reference to FIGS. 17 through 20.

FIG. 17 is a flowchart of an embodiment of a method 1700 of manufacturing the backside-illuminated active pixel sensor array 300 of FIG. 3, according to another aspect of the inventive concept.

Referring to FIGS. 3 and 17, the method 1700 of manufacturing the backside-illuminated active pixel sensor array 300 of FIG. 3 includes operations of forming a semiconductor substrate 320 (operation S1710), forming a wiring layer 330 (operation S1720), and forming a light filter layer 310 (operation S1730). Operation S1710 includes providing or arranging a first support substrate (not shown) (operation S1711), forming the semiconductor substrate 320 of a first conductive type on the first support substrate (operation S1712), forming a pixel isolating layer 322 by implanting an impurity into a rear surface of the semiconductor substrate 320 (operation S1713), forming a portion of a light-receiving device PD by implanting an impurity into the rear surface of the semiconductor substrate 320 (operation S1714), and forming an impurity layer 340 of a second conductive type by implanting an impurity into the rear surface of the semiconductor substrate 320 (operation S1715).

Operation S1720 includes forming a first insulating layer (not shown) on the rear surface of the semiconductor substrate 320 (operation S1721), forming a second support substrate (not shown) on the first insulating layer (operation S1722), removing the first support substrate (operation S1723), forming the other portion of the light-receiving device PD by implanting an impurity into a front surface of the semiconductor substrate 320 (operation S1724), and forming the wiring layer 330 on the front surface of the semiconductor substrate 320 (operation S1725).

Operation S1730 includes forming a third support substrate (not shown) on the wiring layer 330 (operation S1731), removing the second support substrate and the first insulating layer (operation S1732), forming a second insulating layer 316 on the rear surface of the semiconductor substrate 320 (operation S1733), forming a color filter layer 314 on the second insulating layer 316 (operation S1734), and forming a lens layer 312 on the color filter layer 314 (operation S1735).

Figure 18:
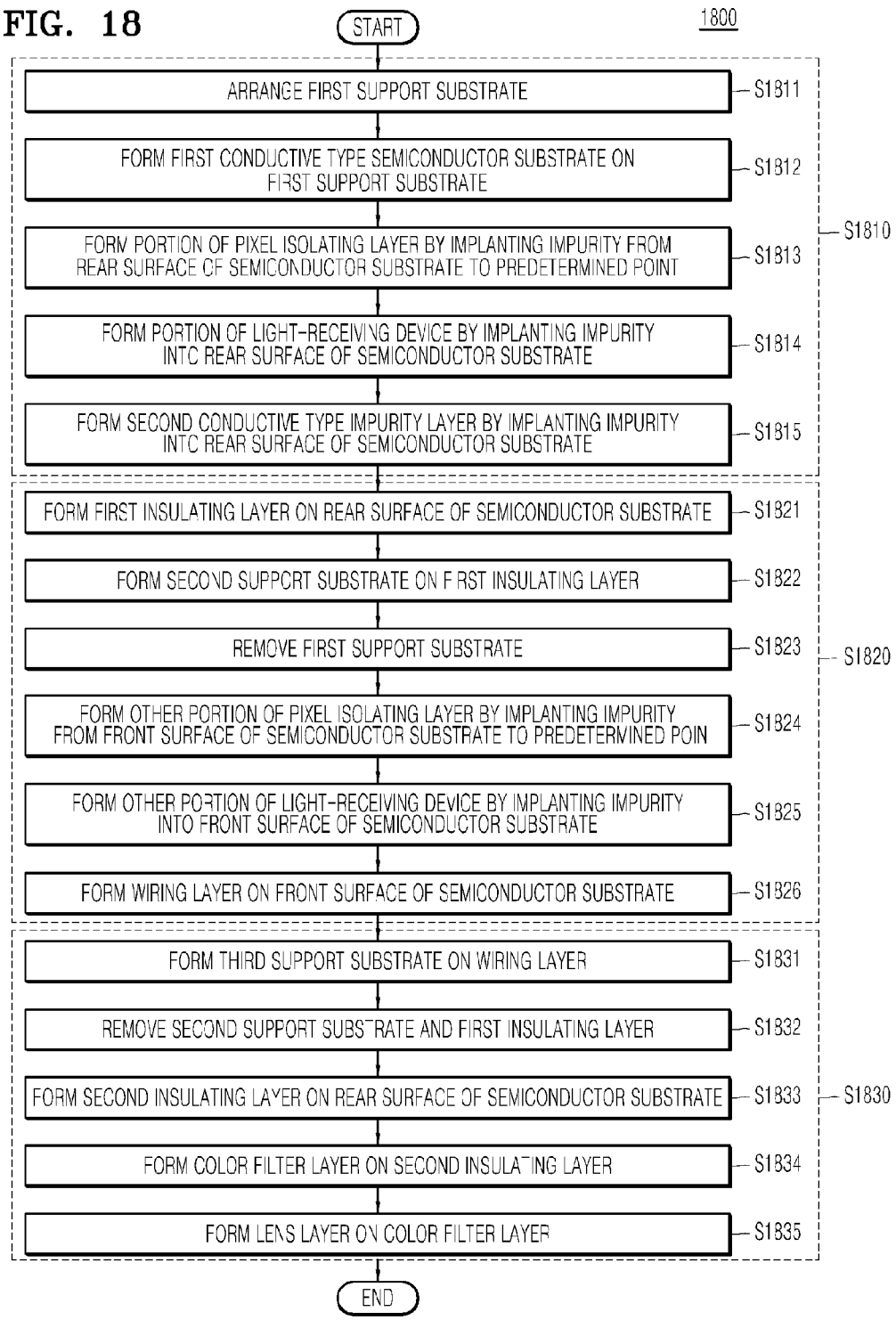
FIG. 18 is a flowchart of another embodiment of a method of manufacturing the backside-illuminated active pixel sensor array of FIG. 4, according to aspects of the inventive concept.

FIG. 18 is a flowchart of an embodiment of a method 1800 of manufacturing the backside-illuminated active pixel sensor array 400 of FIG. 4, according to another aspect of the inventive concept.

Referring to FIGS. 4 and 18, the method 1800 of manufacturing the backside-illuminated active pixel sensor array 400 of FIG. 4 includes operations of forming a semiconductor substrate 420 (operation S1810), forming a wiring layer 430 (operation S1820), and forming a light filter layer 410 (operation S1830). Operation S1810 includes providing or arranging a first support substrate (not shown) (operation S1811), forming the semiconductor substrate 420 of the first conductive type on the first support substrate (operation S1812), forming a portion of the pixel isolating layer 422 by implanting an impurity from a rear surface of the semiconductor substrate 420 to a predetermined point in the semiconductor substrate 420 (operation S1813), forming a portion of a light-receiving device PD by implanting an impurity into the rear surface of the semiconductor substrate 420 (operation S1814), and forming a second conductive type impurity layer 440 by implanting an impurity into the rear surface of the semiconductor substrate 420 (operation S1815).

Operation S1820 includes forming a first insulating layer (not shown) on the rear surface of the semiconductor substrate 420 (operation S1821), forming a second support substrate (not shown) on the first insulating layer (operation S1822), removing the first support substrate (operation S1823), forming the other portion of the pixel isolating layers 422 by implanting an impurity from a front surface of the semiconductor substrate 420 to a predetermined point in the semiconductor substrate 420 (operation S1824), forming the other portion of the light-receiving device PD by implanting an impurity into the front surface of the semiconductor substrate 420 (operation S1825), and forming the wiring layer 430 on the front surface of the semiconductor substrate 420 (operation S1826).

Operation S1830 includes forming a third support substrate (not shown) on the wiring layer 430 (operation S1831), removing the second support substrate and the first insulating layer (operation S1832), forming a second insulating layer 416 on the rear surface of the semiconductor substrate 420 (operation S1833), forming a color filter layer 414 on the second insulating layer 416 (operation S1834), and forming a lens layer 412 on the color filter layer 414 (operation S1835).

Figure 19:
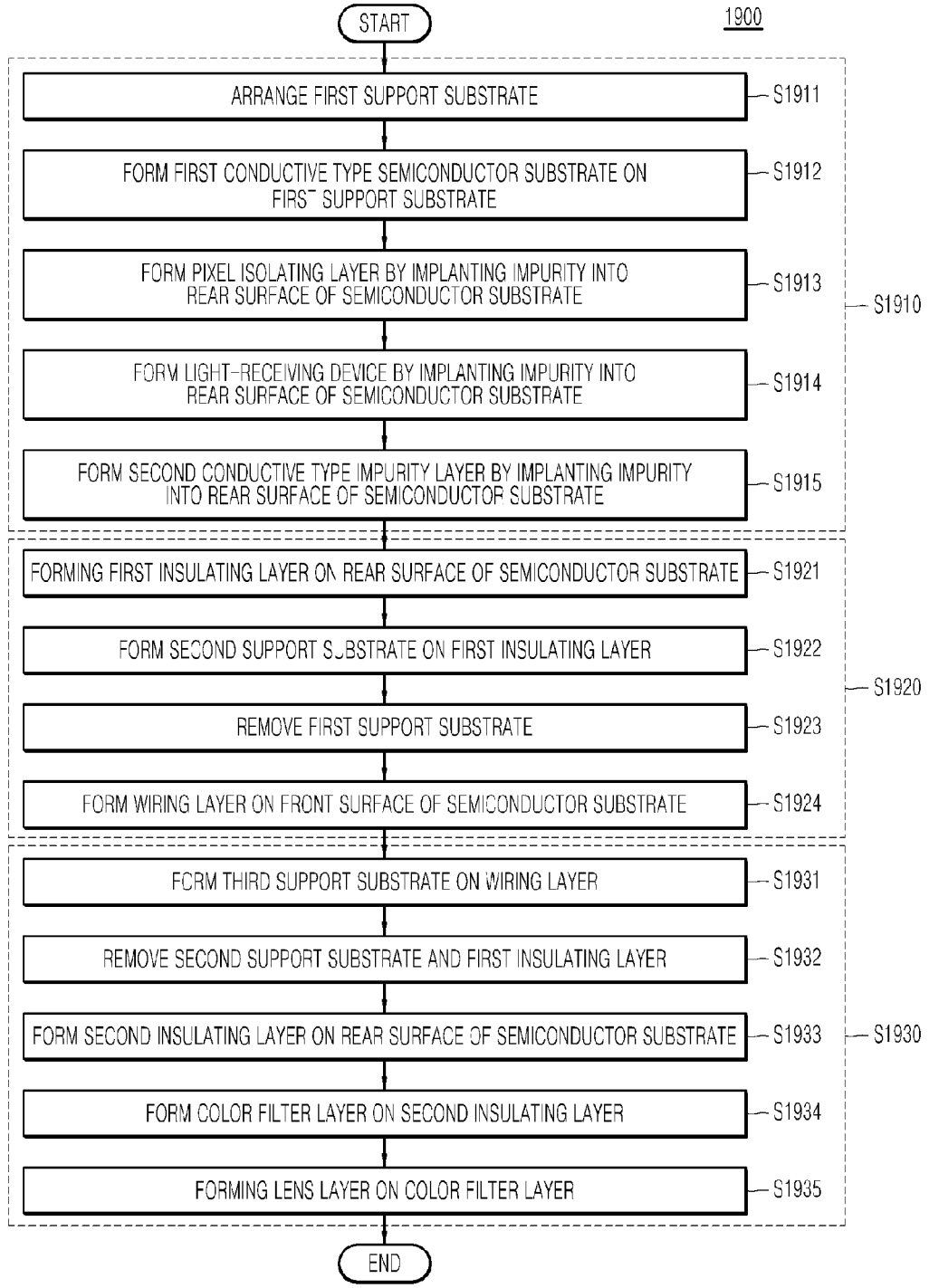
FIG. 19 is a flowchart of another embodiment of a method of manufacturing the backside-illuminated active pixel sensor array of FIG. 5, according to aspects of the inventive concept.

FIG. 19 is a flowchart of another embodiment of a method 1900 of manufacturing the backside-illuminated active pixel sensor array 500 of FIG. 5, according to another aspect of the inventive concept.

Referring to FIGS. 5 and 19, the method 1900 of manufacturing the backside-illuminated active pixel sensor array 500 of FIG. 5 includes operations of forming a semiconductor substrate 520 (operation S1910), forming a wiring layer 530 (operation S1920), and forming the light filter layer 510 (operation S1930). Operation S1910 includes providing or arranging a first support substrate (not shown) (operation S1911), forming the semiconductor substrate 520 of a first conductive type on the first support substrate (operation S1912), forming the pixel isolating layer 522 by implanting an impurity into a rear surface of the semiconductor substrate 520 (operation S1913), forming a light-receiving device PD by implanting an impurity into the rear surface of the semiconductor substrate 520 (operation S1914), and forming an impurity layer 540 of a second conductive type by implanting an impurity into the rear surface of the semiconductor substrate 520 (operation S1915).

Operation S1920 includes forming a first insulating layer (not shown) on the rear surface of the semiconductor substrate 520 (operation S1921), forming a second support substrate (not shown) on the first insulating layer (operation S1922), removing the first support substrate (operation S1923), and forming the wiring layer 530 on a front surface of the semiconductor substrate 520 (operation S1924).

Operation S1930 includes forming a third support substrate (not shown) on the wiring layer 530 (operation S1931), removing the second support substrate and the first insulating layer (operation S1932), forming a second insulating layer 516 on the rear surface of the semiconductor substrate 520 (operation S1933), forming a color filter layer 514 on the second insulating layer 516 (operation S1934), and forming a lens layer 512 on the color filter layer 514 (operation S1935).

Figure 20:
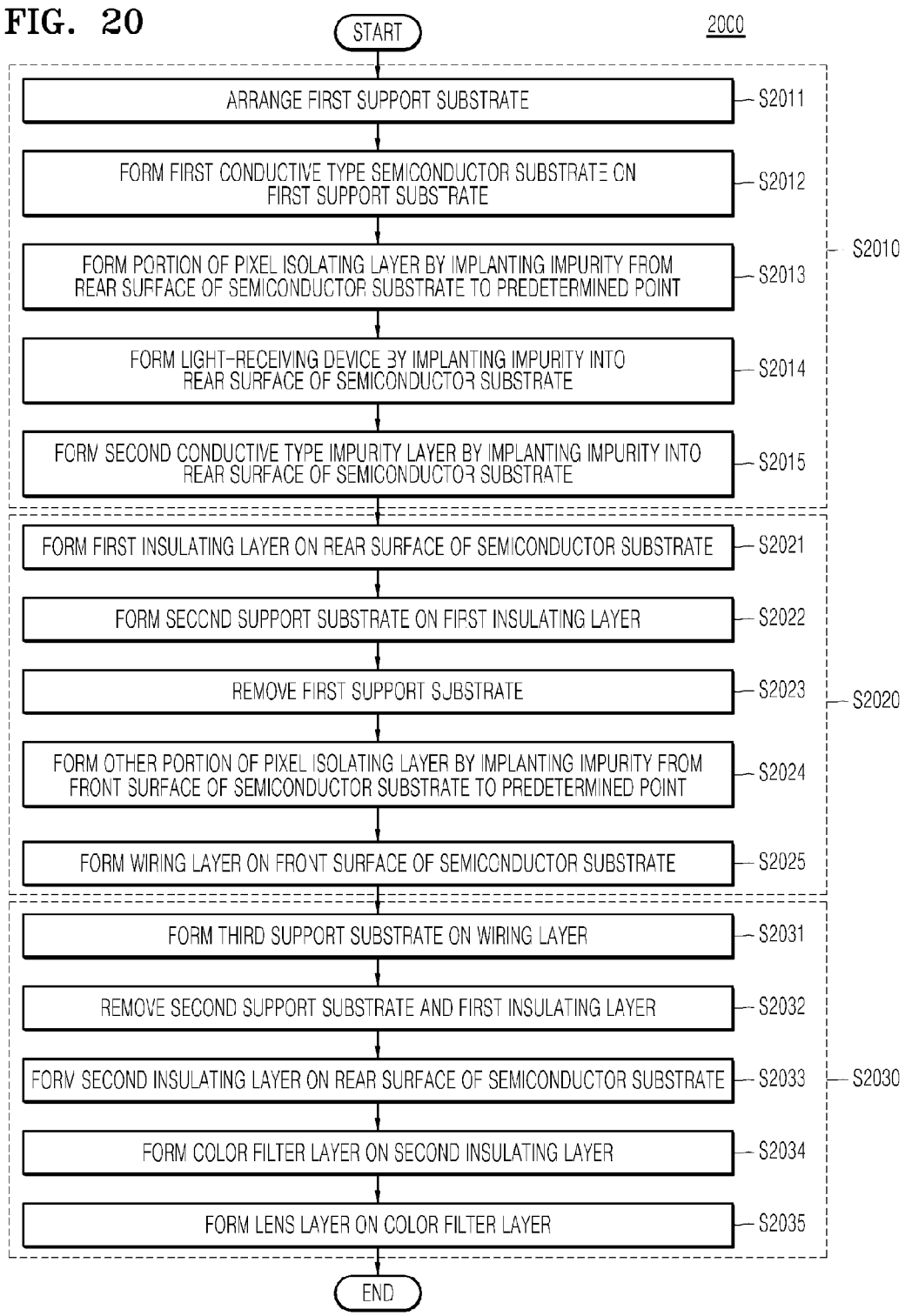
FIG. 20 is a flowchart of another embodiment of a method of manufacturing the backside-illuminated active pixel sensor array of FIG. 6, according to aspects of the inventive concept.

FIG. 20 is a flowchart of an embodiment of a method 2000 of manufacturing the backside-illuminated active pixel sensor array 600 of FIG. 6, according to another aspect of the inventive concept.

Referring to FIGS. 6 and 20, the method 2000 of manufacturing the backside-illuminated active pixel sensor array 600 of FIG. 6 includes operations of forming the semiconductor substrate 620 (operation S2010), forming a wiring layer 630 (operation S2020), and forming a light filter layer 610 (operation S2030). Operation S2010 includes providing or arranging a first support substrate (not shown) (operation S2011), forming the semiconductor substrate 620 of a first conductive type on the first support substrate (operation S2012), forming a portion of the pixel isolating layer 622 by implanting an impurity from a rear surface of the semiconductor substrate 620 to a predetermined point in the semiconductor substrate 620 (operation S2013), forming a light-receiving device PD by implanting an impurity into the rear surface of the semiconductor substrate 620 (operation S2014), and forming a second conductive type impurity layer 640 by implanting an impurity into the rear surface of the semiconductor substrate 620 (operation S2015).

Operation S2020 includes forming a first insulating layer (not shown) on the rear surface of the semiconductor substrate 620 (operation S2021), forming a second support substrate (not shown) on the first insulating layer (operation S2022), removing the first support substrate (operation S2023), forming the other portion of the pixel isolating layers 622 by implanting an impurity from a front surface of the semiconductor substrate 620 to a predetermined point in the semiconductor substrate 620 (operation S2024), and forming the wiring layer 630 on the front surface of the semiconductor substrate 620 (operation S2025).

Operation S2030 includes forming a third support substrate (not shown) on the wiring layer 630 (operation S2031), removing the second support substrate and the first insulating layer (operation S2032), forming a second insulating layer 616 on the rear surface of the semiconductor substrate 620 (operation S2033), forming a color filter layer 614 on the second insulating layer 616 (operation S2034), and forming a lens layer 612 on the color filter layer 614 (operation S2035).

Figure 21:
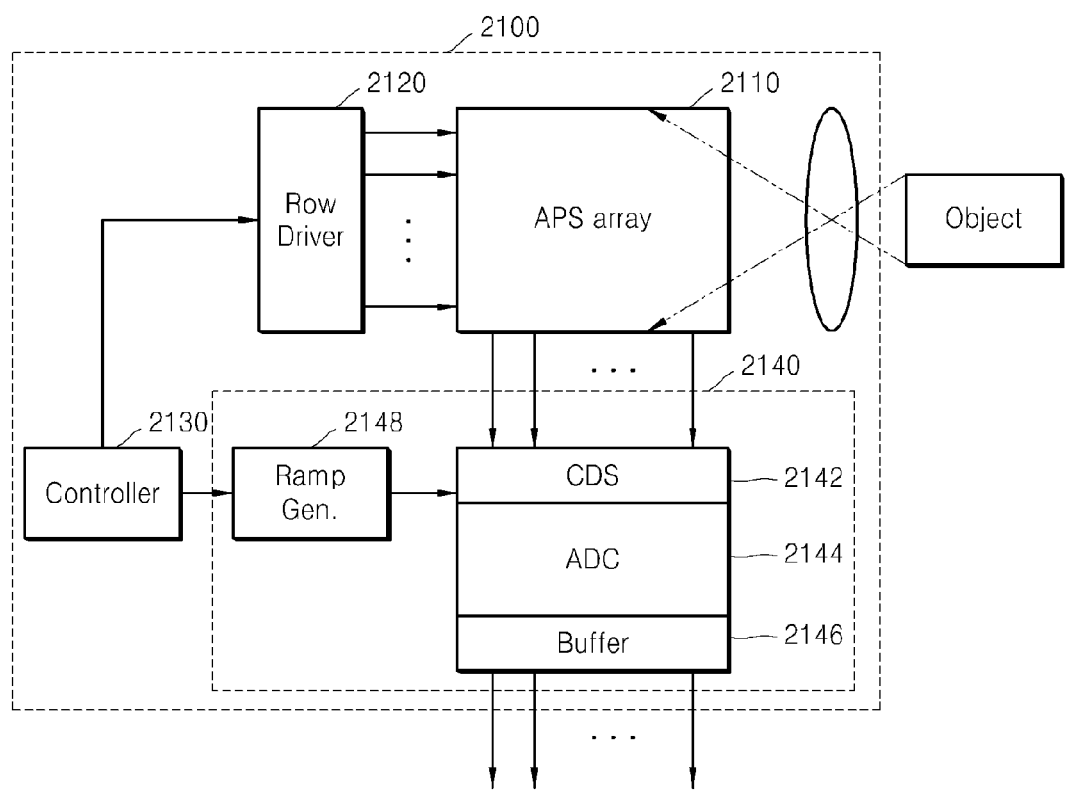
FIG. 21 is a block diagram illustrating an embodiment of a backside illuminated image sensor, according to aspects of the inventive concept.

FIG. 21 is a block diagram of an embodiment of a complementary metal-oxide-semiconductor (CMOS) image sensor 2100, according to aspects of the inventive concept.

Referring to FIG. 21, the CMOS image sensor 2100 includes an active pixel sensor (APS) array 2110, a controller 2130, a row driver 2120, and a pixel signal processing unit 2140. The APS array 2110 may be one of the backside-illuminated active pixel sensor arrays 100, 200, 300, 400, 500, and 600 of FIGS. 1 through 6.

The APS array 2110 includes a plurality of pixels that are two-dimensionally arrayed, each of the pixels including a light-receiving device that performs photoelectric conversion. The APS array 2110 generates charges by receiving light that is incident without interference due to a wiring layer. An electrical signal is provided to the pixel signal processing unit 2140 via a vertical signal line. Pixel sensors in the APS array 2110 are read out one-by-one in a unit of rows. Thus, all pixels in one row of the APS array 2110 are simultaneously activated by a row selection signal output from the row driver 2120. Also, each pixel cell in a selected row provides a signal, which corresponds to received light, to an output line of a corresponding column. In the APS array 2110, each column has a selection line, and pixel cells of each column are selectively output in response to a column selection signal. In the APS array 2110, rows are active in response to an output signal of the row driver 2120.

The controller 2130 controls the row driver 2120 and the pixel signal processing unit 2140 to appropriately process a pixel signal output from the APS array 2110. The pixel signal processing unit 2140 includes a correlated double sampler (CDS) 2142, an analog-to-digital converter (ADC) 2144, and a buffer 2146.

The CDS 2142 receives the electrical signal generated in the APS array 2110 via the vertical signal line, and samples and holds the electrical signal. That is, the CDS 2142 doubly samples a specific noise level and a signal level due to the electrical signal, and then outputs a difference level corresponding to a difference between the noise level and the signal level. The CDS 2142 may receive a ramp value generated in a ramp signal generator Ramp Gen. 2148, may compare the ramp value with the difference level, and then may output a comparison result to an output terminal. The ramp signal generator Ramp Gen. 2148 may operate according to a control signal from the controller 2130.

The ADC 2144 converts an analog signal corresponding to the difference level into a digital signal. The buffer 2146 may include a column memory block (not shown) and a sense amplifier (not shown). The column memory block may include a plurality of memories. The buffer 2146 latches the digital signal, and the latched signal is sequentially output to an image processor (not shown) according to a decoding result in a column decoder (not shown).

The CMOS image sensor 2100 of FIG. 21 may be embodied in a semiconductor chip by further including the image processor. The image processor performs appropriate image processing on digitalized pixel signals and then outputs image data. The CMOS image sensor 2100 may sense an object captured via a lens according to a control by the image processor, and the image processor may output an image, which is sensed and output by the CMOS image sensor 2100, to a display unit (not shown). The display unit can includes any one or more of a variety of types of devices capable of outputting an image. For example, the display unit may include a computer, a mobile phone, tablet, electronic book reader, and other image output terminals. The CMOS image sensor 2100 of FIG. 21 includes one of the backside-illuminated active pixel sensor arrays 100, 200, 300, 400, 500, and 600 of FIGS. 1 through 6. Thus, it is possible to output image data having only small amounts of crosstalk, if any, between adjacent pixels and not having resulting errors.

Figure 22:
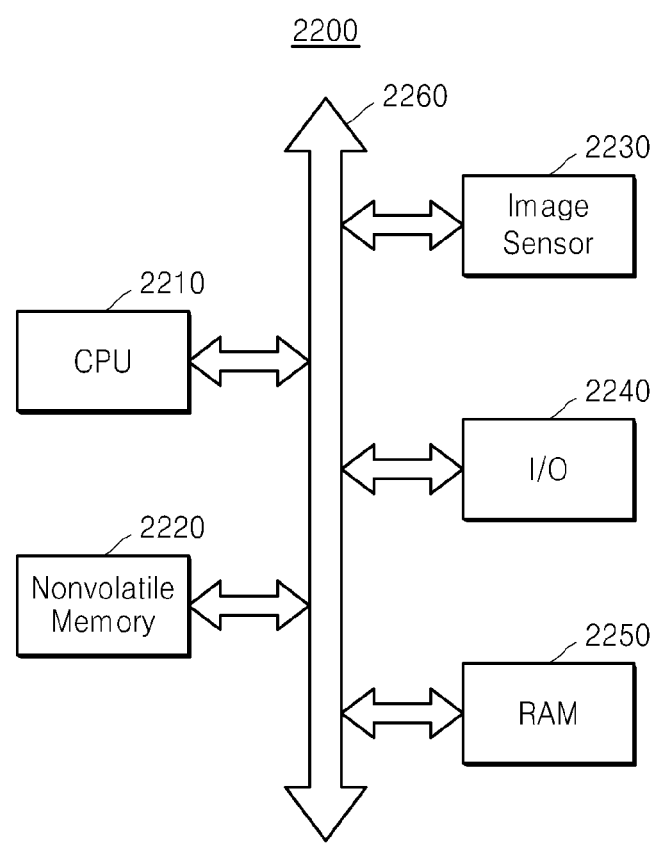
FIG. 22 is a block diagram of an embodiment of a system including the backside-illuminated image sensor of FIG. 21, according to aspects of the inventive concept.

FIG. 22 is a block diagram embodiment of a system 2200 including the CMOS image sensor 2100 of FIG. 21, according to an embodiment of the inventive concept. The system 2200 may be a computer system, a camera system, a scanner, a navigation system, a video phone, a security system, and a motion detection system that require image data.

Referring to FIG. 22, the system 2200 includes a central processing unit (CPU) 2210 or a processor 2210, a non-volatile memory 2220, an image sensor 2230, an input/output (I/O) device 2240, and a random access memory (RAM) 2250. The CPU 2210 performs communication with the I/O device 2240 via a bus 2260. The image sensor 2230 performs communication with the CPU 2210 via the bus 2260. Also, the RAM 2250 and the non-volatile memory 2220 perform communication with the CPU 2210 via the bus 2260. The image sensor 2230 may be an independent semiconductor chip or may be a semiconductor chip that is integrated with the CPU 2210. The image sensor 2230 included in the system 2200 of FIG. 22 includes one of the backside-illuminated active pixel sensor arrays 100, 200, 300, 400, 500, and 600 of FIGS. 1 through 6. Thus, it is possible to output image data having only small amounts of crosstalk, if any, between adjacent pixels and not having resulting errors.

While various embodiments in accordance with the inventive concept have been particularly shown and described with reference to the drawings, it will be understood that various changes in form and details may be made therein without departing from the spirit and scope of the following claims.

What is claimed is:

1. A method of manufacturing a backside-illuminated active pixel sensor array, the method comprising:
    (a) forming a semiconductor substrate that comprises a front surface and a rear surface, light-receiving devices for generating charges in response to light incident via the rear surface, and one or more pixel isolating layers forming boundaries between pixels by being disposed between the adjacent light-receiving devices, including:
        forming the light-receiving devices by implanting ions having a first conductivity type at the front surface of the substrate; and
        forming at least portions of the one or more pixel isolating layers by implanting ions having a second conductivity type at the rear surface of the semiconductor substrate,
        wherein a density of the one or more pixel isolating layers decreases from the rear surface of the semiconductor substrate toward the front surface of the semiconductor substrate;
    (b) forming a wiring layer on the front surface of the semiconductor substrate; and
    (c) forming a light filter layer on the rear surface of the semiconductor substrate.

2. The method of claim 1, wherein part (a) comprises:
    arranging a first support substrate;
    forming the semiconductor substrate on the first support substrate; and
    forming the one or more pixel isolating layers by implanting an impurity of the second conductivity type into the rear surface of the semiconductor substrate.

3. The method of claim 2, wherein part (a) further comprises forming a second conductive type impurity layer by implanting an impurity of the second conductivity type into the rear surface of the semiconductor substrate.

4. The method of claim 3, wherein part (b) comprises:
    forming a first insulating layer on the rear surface of the semiconductor substrate;
    forming a second support substrate on the first insulating layer;
    removing the first support substrate; and
    forming the wiring layer on the front surface of the semiconductor substrate.

5. The method of claim 4, wherein part (b) further comprises forming a first conductive type impurity region of each of the light-receiving devices by implanting an impurity of the first conductivity type into the front surface of the semiconductor substrate, and
    wherein the first conductive type impurity region of each of the light-receiving devices has a greater doping density than the semiconductor substrate.

6. The method of claim 5, wherein part (c) comprises:
    forming a third support substrate on the wiring layer;
    removing the second support substrate and the first insulating layer;
    forming a second insulating layer on the rear surface of the semiconductor substrate;
    forming a color filter layer on the second insulating layer; and forming a lens layer on the color filter layer.

7. The method of claim 5, wherein part (c) comprises:
    forming a third support substrate on the wiring layer;
    removing the second support substrate and the first insulating layer;
    forming a second insulating layer on the rear surface of the semiconductor substrate;
    forming a color filter layer on the second insulating layer; and
    forming a lens layer on the color filter layer.

8. The method of claim 1, wherein part (a) comprises:
    arranging a first support substrate;
    forming the semiconductor substrate on the first support substrate; and
    forming portions of the one or more pixel isolating layers by implanting an impurity of the second conductivity type into the rear surface of the semiconductor substrate; and
    forming other portions of the one or more pixel isolating layers by implanting an impurity of the second conductivity type into the front surface of the semiconductor substrate.

9. The method of claim 8, wherein part (a) further comprises forming a second conductive type impurity layer by implanting an impurity of the second conductivity type into the rear surface of the semiconductor substrate.

10. The method of claim 9, wherein part (b) comprises:
    forming a first insulating layer on the rear surface of the semiconductor substrate;
    forming a second support substrate on the first insulating layer;
    removing the first support substrate; and
    forming the wiring layer on the front surface of the semiconductor substrate.

11. A method of manufacturing a backside-illuminated active pixel sensor array, the method comprising:
    (a) forming a semiconductor substrate that comprises a front surface and a rear surface, light-receiving devices for generating charges in response to light incident via the rear surface, and one or more pixel isolating layers forming boundaries between pixels by being disposed between the adjacent light-receiving devices, comprising:
  arranging a first support substrate;
  forming the semiconductor substrate on the first support substrate; and
  forming the one or more pixel isolating layers by implanting an impurity into the rear surface of the semiconductor substrate;
(b) forming a wiring layer on the front surface of the semiconductor substrate, comprising:
  forming a first insulating layer on the rear surface of the semiconductor substrate;
  forming a second support substrate on the first insulating layer;
  removing the first support substrate; and
  forming the wiring layer on the front surface of the semiconductor substrate; and
(c) forming a light filter layer on the rear surface of the semiconductor substrate,
wherein portions or all of the one or more pixel isolating layers are second conductive type impurity doped regions formed by ion implantation at the rear surface of the semiconductor substrate.

12. The method of claim 11, wherein part (b) further comprises forming a first conductive type impurity region of each of the light-receiving devices by implanting an impurity into the front surface of the semiconductor substrate, and
wherein the first conductive type impurity region of each of the light-receiving devices has a greater doping density than the semiconductor substrate.

13. A method of manufacturing a backside-illuminated active pixel sensor array, the method comprising:
(a) forming a semiconductor substrate that comprises a front surface and a rear surface, light-receiving devices for generating charges in response to light incident via the rear surface, and one or more pixel isolating layers forming boundaries between pixels by being disposed between the adjacent light-receiving devices, comprising:
  arranging a first support substrate;
  forming the semiconductor substrate on the first support substrate; and
  forming portions of the one or more pixel isolating layers by implanting an impurity into the rear surface of the semiconductor substrate;
(b) forming a wiring layer on the front surface of the semiconductor substrate, comprising:
  forming a first insulating layer on the rear surface of the semiconductor substrate;
  forming a second support substrate on the first insulating layer;
  removing the first support substrate; and
  forming the wiring layer on the front surface of the semiconductor substrate; and
(c) forming a light filter layer on the rear surface of the semiconductor substrate,
wherein portions or all of the one or more pixel isolating layers are second conductive type impurity doped regions formed by ion implantation at the rear surface of the semiconductor substrate.

\* \* \* \* \*